United States Patent
Baliga

(10) Patent No.: US 6,649,975 B2
(45) Date of Patent: Nov. 18, 2003

(54) VERTICAL POWER DEVICES HAVING TRENCH-BASED ELECTRODES THEREIN

(75) Inventor: Bantval Jayant Baliga, Raleigh, NC (US)

(73) Assignee: Silicon Semiconductor Corporation, Research Triangle Park, NC (US)

( * ) Notice: Subject to any disclaimer, the term of this patent is extended or adjusted under 35 U.S.C. 154(b) by 0 days.

(21) Appl. No.: 09/992,104

(22) Filed: Nov. 5, 2001

(65) Prior Publication Data

US 2002/0056884 A1 May 16, 2002

Related U.S. Application Data

(60) Provisional application No. 60/249,116, filed on Nov. 16, 2000.

(51) Int. Cl.[7] .......................... H01L 29/94; H01L 29/96
(52) U.S. Cl. ...................... 257/330; 257/329; 257/328; 257/327
(58) Field of Search ................................. 257/327, 328, 257/329, 330, 331, 340, 342, 365, 492, 493, 288

(56) References Cited

U.S. PATENT DOCUMENTS

| | | | | |
|---|---|---|---|---|
| 5,282,018 A | * | 1/1994 | Hiraki et al. | 257/296 |
| 5,945,708 A | * | 8/1999 | Tihanyi | 257/331 |
| 5,973,360 A | * | 10/1999 | Tihanyi | 257/330 |
| 5,998,833 A | * | 12/1999 | Baliga | 257/329 |
| 6,452,230 B1 | | 9/2002 | Boden, Jr. | |
| 2002/0175351 A1 | * | 11/2002 | Baliga | 257/242 |
| 2003/0047788 A1 | * | 3/2003 | Disney et al. | 257/367 |

* cited by examiner

Primary Examiner—Nathan J. Flynn
Assistant Examiner—Johannes Mondt
(74) Attorney, Agent, or Firm—Myers Bigel Sibley & Sajovec

(57) ABSTRACT

Vertical power devices include a semiconductor substrate having a drift region of first conductivity type therein and first and second stripe-shaped trenches that extend in the semiconductor substrate and define a drift region mesa therebetween. First and second insulated source electrodes are provided in the first and second stripe-shaped trenches, respectively. A UMOSFET, comprising a third trench that is shallower than the first and second stripe-shaped trenches, is provided in the drift region mesa.

8 Claims, 35 Drawing Sheets

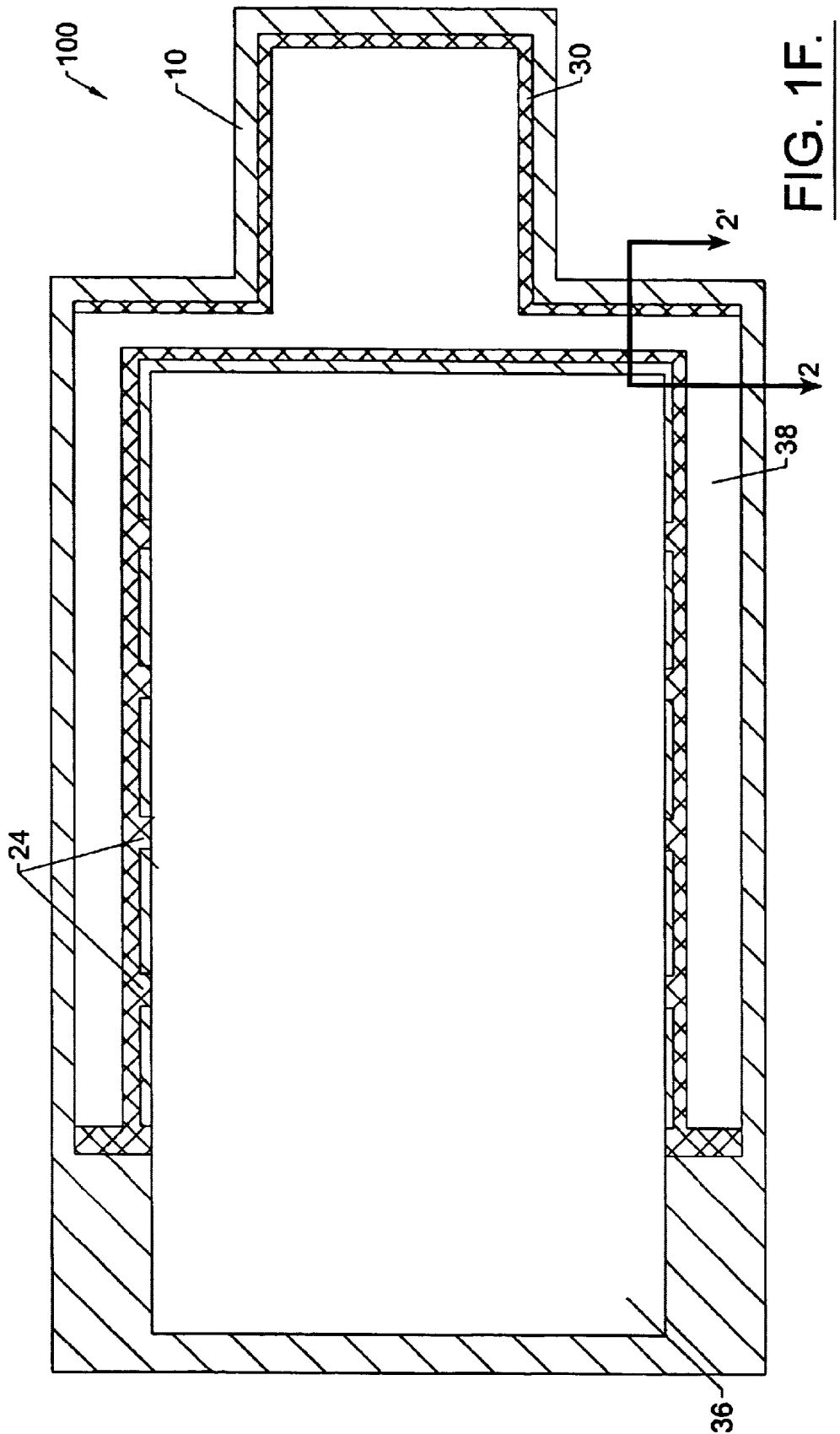

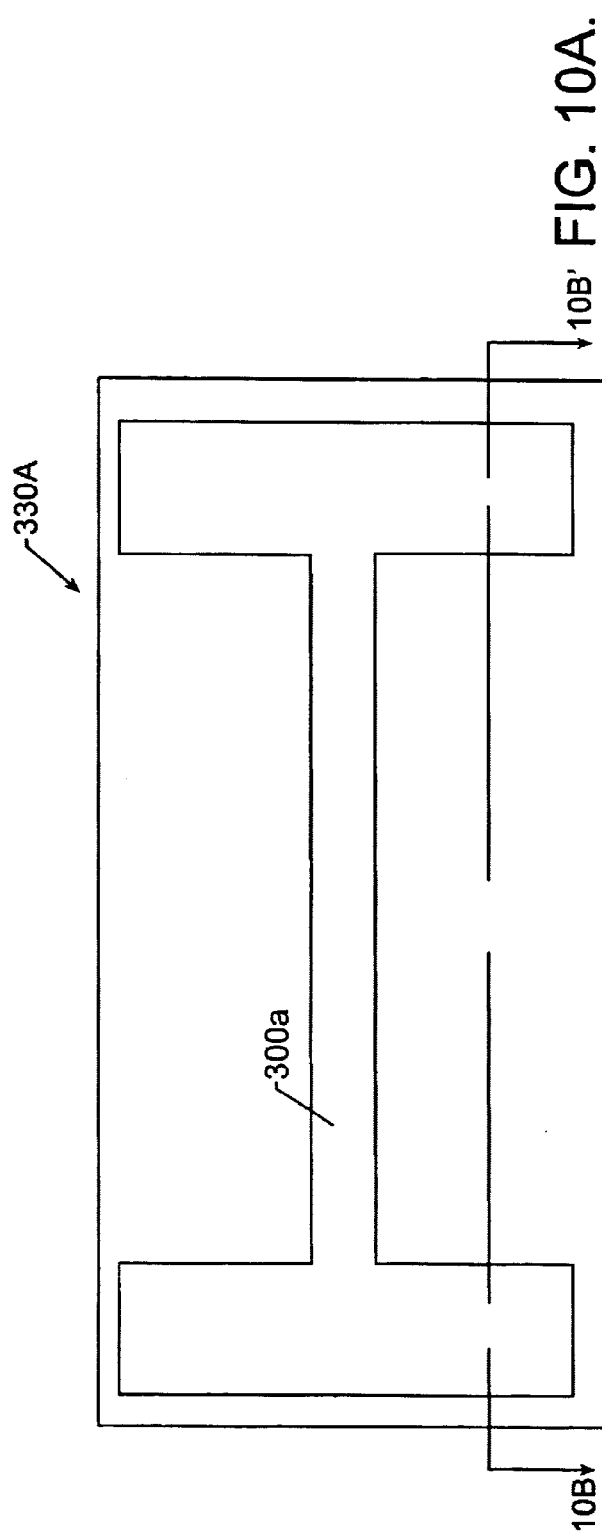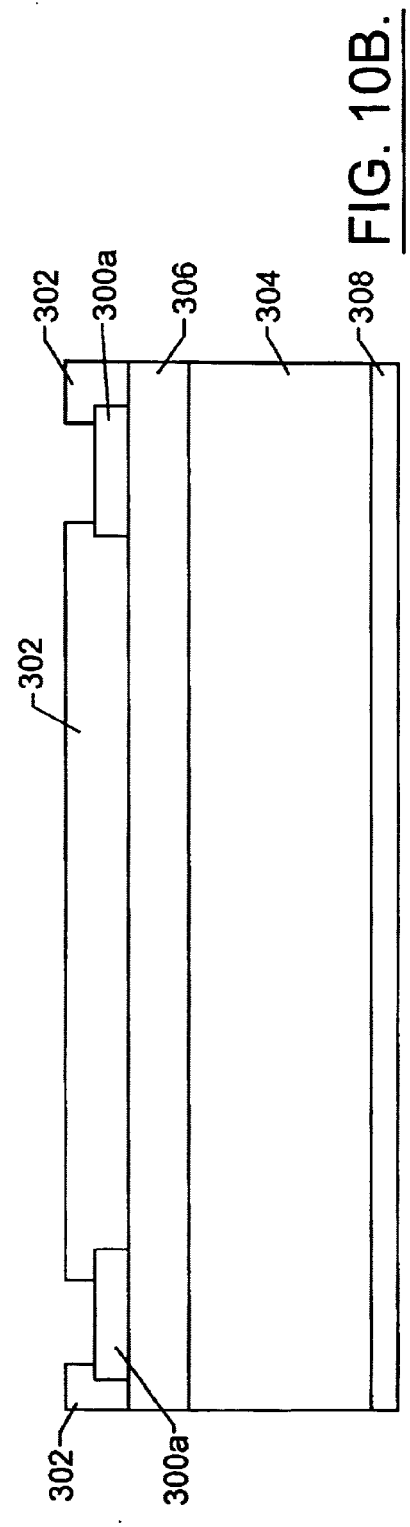

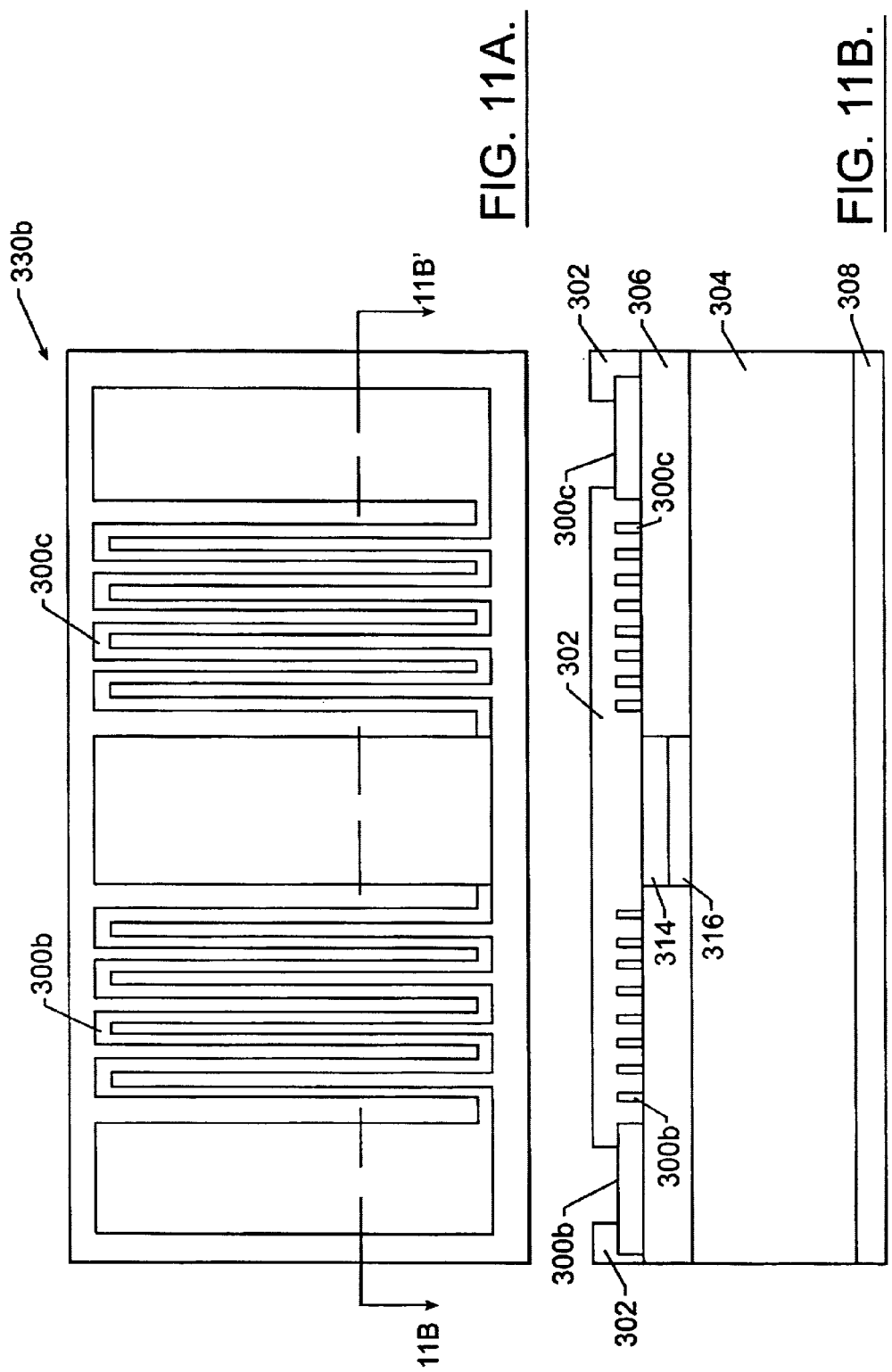

VERTICAL POWER DEVICES HAVING TRENCH-BASED ELECTRODES THEREIN

REFERENCE TO PRIORITY APPLICATION

This application claims priority to U.S. Provisional Application Ser. No. 60/249,116, filed Nov. 16, 2000, the disclosure of which is hereby incorporated herein by reference.

FIELD OF THE INVENTION

The present invention relates to semiconductor switching devices, and more particularly to switching devices for power switching and power amplification applications and methods of forming same.

BACKGROUND OF THE INVENTION

Power MOSFETs have typically been developed for applications requiring power switching and power amplification. For power switching applications, the commercially available devices are typically DMOSFETs and UMOSFETs. In these devices, one main objective is obtaining a low specific on-resistance to reduce power losses. In a power MOSFET, the gate electrode provides turn-on and turn-off control upon the application of an appropriate gate bias. For example, turn-on in an N-type enhancement mode MOSFET occurs when a conductive N-type inversion-layer channel is formed in the P-type base region (also referred to as "channel region") in response to the application of a positive gate bias. The inversion-layer channel electrically connects the N-type source and drain regions and allows for majority carrier conduction therebetween.

The power MOSFET's gate electrode is separated from the base region by an intervening insulating layer, typically silicon dioxide. Because the gate is insulated from the base region, little if any gate current is required to maintain the MOSFET in a conductive state or to switch the MOSFET from an on-state to an off-state or vice-versa. The gate current is kept small during switching because the gate forms a capacitor with the MOSFET's base region. Thus, only charging and discharging current ("displacement current") is required during switching. Because of the high input impedance associated with the insulated-gate electrode, minimal current demands are placed on the gate and the gate drive circuitry can be easily implemented. Moreover, because current conduction in the MOSFET occurs through majority carrier transport through an inversion-layer channel, the delay associated with the recombination and storage of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also be easily paralleled, because the forward voltage drop across power MOSFETs increases with increasing temperature, thereby promoting an even current distribution in parallel connected devices.

DMOSFETs and UMOSFETs are more fully described in a textbook by B. J. Baliga entitled *Power Semiconductor Devices*, PWS Publishing Co. (ISBN 0-534-94098-6) (1995), the disclosure of which is hereby incorporated herein by reference. Chapter 7 of this textbook describes power MOSFETs at pages 335–425. Examples of silicon power MOSFETs including accumulation, inversion and extended trench FETs having trench gate electrodes extending into an N+ drain region are also disclosed in an article by T. Syau, P. Venkatraman and B. J. Baliga, entitled *Comparison of Ultralow Specific On-Resistance UMOSFET Structures: The ACCUFET, EXTFET, INVFET, and Conventional UMOSFETs*, IEEE Transactions on Electron Devices, Vol. 41, No. 5, May (1994). As described by Syau et al., specific on-resistances in the range of 100–250 $\mu\Omega cm^2$ were experimentally demonstrated for devices capable of supporting a maximum of 25 volts. However, the performance of these devices was limited by the fact that the forward blocking voltage must be supported across the gate oxide at the bottom of the trench. U.S. Pat. No. 4,680,853 to Lidow et al. also discloses a conventional power MOSFET that utilizes a highly doped N+ region 130 between adjacent P-base regions in order to reduce on-state resistance. For example, FIG. 22 of Lidow et al. discloses a high conductivity region 130 having a constant lateral density and a gradient from relatively high concentration to relatively low concentration beginning from the chip surface beneath the gate oxide and extending down into the body of the chip.

FIG. 1(*d*) from the aforementioned Syau et al. article discloses a conventional UMOSFET structure. In the blocking mode of operation, this UMOSFET supports most of the forward blocking voltage across the N-type drift layer, which must be doped at relatively low levels to obtain a high maximum blocking voltage capability, however low doping levels typically increase the on-state series resistance. Based on these competing design requirements of high blocking voltage and low on-state resistance, a fundamental figure-of-merit (FOM) for power devices has been derived which relates specific on-resistance ($R_{on,sp}$) to the maximum blocking voltage (BV). As explained at page 373 of the aforementioned textbook to B. J. Baliga, the ideal specific on-resistance for an N-type silicon drift region is given by the following relation:

$$R_{on,sp}=5.93\times 10^{-9}(BV)^{2.5} \qquad (1)$$

Thus, for a device with 60 volt blocking capability, the ideal specific on-resistance is 170 $\mu\Omega cm^2$. However, because of the additional resistance contribution from the channel, reported specific on-resistances for UMOSFETs are typically much higher. For example, a UMOSFET having a specific on-resistance of 730 $\mu\Omega cm^2$ is disclosed in an article by H. Chang, entitled *Numerical and Experimental Comparison of 60V Vertical Double-Diffused MOSFETs and MOSFETs With A Trench-Gate Structure*, Solid-State Electronics, Vol. 32, No. 3, pp. 247–251 (1989). However, in this device, a lower-than-ideal uniform doping concentration in the drift region was required to compensate for the high concentration of field lines near the bottom corner of the trench when blocking high forward voltages. U.S. Pat. Nos. 5,637,989, 5,742,076 and 5,912,497 also disclose popular power semiconductor devices having vertical current carrying capability. The disclosures of these patents are hereby incorporated herein by reference.

In particular, U.S. Pat. No. 5,637,898 to Baliga discloses a preferred silicon field effect transistor which is commonly referred to as a graded-doped (GD) UMOSFET. As illustrated by FIG. 3 from the '898 patent, a unit cell 100 of an integrated power semiconductor device field effect transistor may have a width "$W_c$" of 1 $\mu m$ and comprise a highly doped drain layer 114 of first conductivity type (e.g., N+) substrate, a drift layer 112 of first conductivity type having a linearly graded doping concentration therein, a relatively thin base layer 116 of second conductivity type (e.g., P-type) and a highly doped source layer 118 of first conductivity type (e.g., N+). The drift layer 112 may be formed by epitaxially growing an N-type in-situ doped monocrystalline silicon layer having a thickness of 4 μm on an N-type drain layer 114 having a thickness of 100 μm and a doping concentration of greater than $1 \times 10^{18}$ cm$^{-3}$ (e.g. $1 \times 10^{19}$ cm$^{-3}$) therein. The drift layer 112 also has a linearly graded doping concentration therein with a maximum concentration of $3 \times 10^{17}$ cm$^{-3}$ at the N+/N junction with the drain layer 114, and a minimum concentration of $1 \times 10^{16}$ cm$^{-3}$ beginning at a distance 3 μm from the N+/N junction (i.e., at a depth of 1 μm) and continuing at a uniform level to the upper face. The base layer 116 may be formed by implanting a P-type dopant such as boron into the drift layer 112 at an energy of 100 kEV and at a dose level of $1 \times 10^{14}$ cm$^{-2}$. The P-type dopant may then be diffused to a depth of 0.5 μm into the drift layer 112. An N-type dopant such as arsenic may also be implanted at an energy of 50 kEV and at dose level of $1 \times 10^{15}$ cm$^{-2}$. The N-type and P-type dopants can then be diffused simultaneously to a depth of 0.5 μm and 1.0 μm, respectively, to form a composite semiconductor substrate containing the drain, drift, base and source layers.

A stripe-shaped trench having a pair of opposing sidewalls 120a which extend in a third dimension (not shown) and a bottom 120b is then formed in the substrate. For a unit cell 100 having a width $W_c$ of 1 μm, the trench is preferably formed to have a width "$W_t$" of 0.5 μm at the end of processing. An insulated gate electrode, comprising a gate insulating region 124 and an electrically conductive gate 126 (e.g., polysilicon), is then formed in the trench. The portion of the gate insulating region 124 extending adjacent the trench bottom 120b and the drift layer 112 may have a thickness "$T_1$" of about 2000 Å to inhibit the occurrence of high electric fields at the bottom of the trench and to provide a substantially uniform potential gradient along the trench sidewalls 120a. The portion of the gate insulating region 124 extending opposite the base layer 116 and the source layer 118 may have a thickness "$T_2$" of about 500 Å to maintain the threshold voltage of the device at about 2–3 volts. Simulations of the unit cell 100 at a gate bias of 15 Volts confirm that a vertical silicon field effect transistor having a maximum blocking voltage capability of 60 Volts and a specific on-resistance ($R_{sp,on}$) of 40 μΩcm$^2$, which is four (4) times smaller than the ideal specific on-resistance of 170 μΩcm$^2$ for a 60 volt power UMOSFET, can be achieved. Notwithstanding these excellent characteristics, the transistor of FIG. 3 of the '898 patent may suffer from a relatively low high-frequency figure-of-merit (HFOM) if the overall gate-to-drain capacitance ($C_{GD}$) is too large. Improper edge termination of the MOSFET may also prevent the maximum blocking voltage from being achieved. Additional UMOSFETs having graded drift regions and trench-based source electrodes are also disclosed in U.S. Pat. No. 5,998,833 to Baliga, the disclosure of which is hereby incorporated herein by reference.

Power MOSFETs may also be used in power amplification applications (e.g., audio or rf). In these applications the linearity of the transfer characteristic (e.g., $I_d$ v. $V_g$) becomes very important in order to minimize signal distortion. Commercially available devices that are used in these power amplification applications are typically the LDMOS and gallium arsenide MESFETs. However, as described below, power MOSFETs including LDMOS transistors, may have non-linear characteristics that can lead to signal distortion. The physics of current saturation in power MOSFETs is described in a textbook by S. M. Sze entitled "Physics of Semiconductor Devices, Section 8.2.2, pages 438–451 (1981). As described in this textbook, the MOSFET typically works in one of two modes. At low drain voltages (when compared with the gate voltage), the MOSFET operates in a linear mode where the relationship between $I_d$ and $V_g$ is substantially linear. Here, the transconductance ($g_m$) is also independent of $V_g$:

$$g_m = (Z/L) u_{ns} C_{ox} V_d \qquad (2)$$

where Z and L are the channel width and length, respectively, $u_{ns}$ is the channel mobility, $C_{ox}$ is the specific capacitance of the gate oxide, and $V_d$ is the drain voltage. However, once the drain voltage increases and becomes comparable to the gate voltage ($V_g$), the MOSFET operates in the saturation mode as a result of channel pinch-off. When this occurs, the expression for transconductance can be expressed as:

$$g_m = (Z/L) u_{ns} C_{ox} (V_g - V_{th}) \qquad (3)$$

where $V_g$ represents the gate voltage and $V_{th}$ represents the threshold voltage of the MOSFET. Thus, as illustrated by equation (3), during saturation operation, the transconductance increases with increasing gate bias. This makes the relationship between the drain current (on the output side) and the gate voltage (on the input side) non-linear because the drain current increases as the square of the gate voltage. This non-linearity can lead to signal distortion in power amplifiers. In addition, once the voltage drop along the channel becomes large enough to produce a longitudinal electric field of more than about $1 \times 10^4$ V/cm while remaining below the gate voltage, the electrons in the channel move with reduced differential mobility because of carrier velocity saturation.

Thus, notwithstanding attempts to develop power MOSFETs for power switching and power amplification applications, there continues to be a need to develop power MOSFETs that can support high voltages and have improved electrical characteristics, including highly linear transfer characteristics when supporting high voltages.

SUMMARY OF THE INVENTION

Integrated power devices according to first embodiments of the present invention utilize Faraday shield layers to improve device characteristics by reducing parasitic capacitance between terminals of the device. In particular, integrated power devices, which may comprise a plurality of field effect transistor unit cells therein, utilize Faraday shield layers to reduce parasitic gate-to-drain capacitance (Cgd) and concomitantly improve high frequency switching performance. Each of these power devices may include a field effect transistor in an active portion of a semiconductor substrate and a gate electrode that is electrically connected to a gate of the field effect transistor. A Faraday shield layer is provided between at least a first portion of the gate electrode and a drain of the field effect transistor in order to capacitively decouple the first portion of the gate electrode from the drain. The gate electrode and drain typically extend adjacent opposing faces of the semiconductor substrate. The Faraday shield layer is preferably electrically connected to a source of the field effect transistor.

Power devices according to the first embodiments may also include a plurality of field effect transistor cells disposed side-by-side in an active portion of a semiconductor substrate. The plurality of field effect transistor cells may include vertical field effect transistor cells that extend between first and second opposing faces of the semiconductor substrate. A Faraday shield layer is provided that extends on a portion of the first face of the semiconductor substrate that is located outside a perimeter of the active portion. A gate electrode of the device is electrically connected to each gate of the plurality of field effect transistor cells. The Faraday shield layer underlies the gate electrode and separates it from a drain of the power device The gate electrode also extends outside the perimeter of the active portion (containing the transistor cells) in a manner that substantially confines it to within an outer perimeter of the Faraday shield layer. In this manner, the parasitic gate-to-drain capacitance of the power device can be reduced by capacitively decoupling at least a majority portion of the gate electrode from the drain of the device. A source electrode, which is electrically coupled to each source of the plurality of field effect transistor cells, is also electrically connected to the Faraday shield layer. An intermediate electrically insulating layer is disposed between the Faraday shield layer and the gate electrode. The thickness and material characteristics of the intermediate electrically insulating layer influence, among other things, the degree to which the parasitic gate-to-source capacitance of the device is increased by the presence of the Faraday shield layer. In particular, the thickness, layout and material characteristics of the intermediate insulating layer are preferably chosen so that any impairment in switching performance caused by an increase in parasitic gate-to-source capacitance is significantly outweighed by the improvement in switching performance achieved by reduced parasitic gate-to-drain capacitance.

High frequency switching performance is also enhanced by integrating a gate electrode strip line on the semiconductor substrate. The gate electrode strip line preferably has a first end connected to the gate electrode and a second end connected to a gate pad of the power device. The gate pad extends outside the active portion of the semiconductor substrate. The gate electrode strip line is provided to enhance RF switching performance and is patterned to extend opposite the Faraday shield layer, with the intermediate insulating layer extending therebetween. To maintain a low parasitic gate-to-drain capacitance, the gate electrode, gate electrode strip line and gate pad are preferably patterned so that they are at least substantially confined within an outer perimeter of the Faraday shield layer.

According to other aspects of the preferred power devices, the intermediate electrically insulating layer is designed to provide electrostatic discharge (ESD) protection. In particular, the intermediate electrically insulating layer is designed so that the maximum breakdown voltage that the intermediate electrically insulating layer (or regions therein) can support is less than the maximum breakdown voltage that the gate insulator (e.g., gate oxide) can support between the gate(s) and channel region(s) of the power device. To provide this ESD capability, the intermediate electrically insulating layer preferably comprises a plurality of regions of different electrically insulating materials having different breakdown voltage characteristics. These regions may be spaced side-by-side relative to each other. In particular, some of the electrically insulating regions within the intermediate electrically insulating layer may comprise materials that can support high breakdown voltages but preferably have relatively low dielectric constants (to reduce parasitic gate-to-source capacitance). Other insulating regions within the intermediate electrically insulating layer may comprise materials that can only support relatively low breakdown voltages. The electrically insulating regions that can support relatively high and relatively low breakdown voltages will be referred to herein as strong breakdown regions and weak breakdown regions, respectively. The weak breakdown regions, which experience breakdown first in response to excessive voltage spikes that may be caused by ESD events, provide an electrical path for ESD current that is outside the active portion of the power device. These weak breakdown regions may comprise zinc oxide (ZnO). According to these aspects, the gate pad (and/or gate electrode), the weak breakdown regions and the Faraday shield layer collectively form a metal oxide varistor (MOV). The weak breakdown regions may also comprise intrinsic or P-type polycrystalline silicon.

Vertical power devices according to second embodiments of the present invention utilize discontinuous deep trench regions to improve operating performance by, among other things, lowering specific on-state resistance. These vertical power devices include a semiconductor substrate having a first surface thereon and a drift region of first conductivity type (e.g., N-type) therein. For each power device unit cell, a quad arrangement of trenches is provided that extends into the first surface of the semiconductor substrate and defines a drift region mesa that extends between the trenches. A base region of second conductivity type (e.g., P-type) is also provided that extends into the drift region mesa and forms a first P-N rectifying junction therewith. Within each base region, a respective source region is provided. An insulated electrode is provided in each of the trenches. These trench-based insulated electrodes are electrically connected together and to the source region by a source electrode that preferably extends on the first surface. An insulated gate is also provided on the first surface. The insulated gate electrode may be a stripe-shaped electrode that extends on the drift region mesa, and between the trenches.

The quad arrangement of trenches in each unit cell includes a first pair of trenches at a front of the unit cell and a second pair of trenches at a rear of the unit cell, when the device is viewed in transverse cross-section. According to a preferred aspect of these vertical power devices, the source region extends along the first surface in a lengthwise direction from the front to the rear of the device without interruption by the base region. This lack of interruption of the source region by the base region increases the area of the on-state current path. Contact between the source electrode and base region is nonetheless made directly to the base region, which extends along the first surface in the lengthwise direction from a sidewall of a trench in the first pair to a sidewall of an opposing trench in the second pair. A Faraday shield layer may also be provided that extends on the first surface and surrounds the quad arrangement of trenches. A gate electrode strip line (and gate pad) may also be provided on the Faraday shield layer and an intermediate electrically insulating layer may be provided between the Faraday shield layer and the gate electrode strip line. The intermediate electrically insulating layer may be designed to provide electrostatic discharge protection (ESD).

Additional embodiments of the present invention include packaged power devices. According to these embodiments, a packaged power device includes a device package having an electrically conductive flange therein that contains a slot. An electrically conductive substrate is mounted within the slot in the flange and a dielectric layer is provided on the electrically conductive substrate. The electrically conductive substrate may comprise a semiconductor substrate. If a gate electrode strip line is not integrated within the power device in a preferred manner as described above, the gate electrode strip line may be patterned on the dielectric layer so that it extends opposite the electrically conductive substrate. A vertical power MOSFET is also provided within the package and this power MOSFET has a source electrically coupled and mounted to a first portion of the flange located outside the slot and a gate electrode electrically coupled and mounted to a first end of the gate electrode strip line. A drain terminal is also mounted to the flange and is electrically coupled to a drain of the vertical power device. A gate terminal is mounted to the flange and is electrically coupled to a second end of the gate electrode strip line by a gate metal strap. The source of the vertical power MOSFET is preferably connected to the first portion of the flange by a first solder bond and the gate electrode is electrically connected to the first end of the gate electrode strip line by a second solder bond. In this manner, the flange constitutes a source terminal. An LC network may be provided by integrating a capacitor on the electrically conductive substrate along with gate electrode strip line. The capacitor may include a polysilicon capacitor electrode that is electrically connected to the gate electrode strip line, with the polysilicon capacitor electrode, the dielectric layer and the electrically conductive substrate collectively forming a MOS capacitor.

Packaged power transistors according to still further embodiments of the present invention may also include a package with an electrically conductive flange therein that contains a slot. A ceramic substrate may be mounted within the slot and a gate electrode strip line may be patterned on the ceramic substrate. A vertical power MOSFET is also provide within the package and this vertical power MOSFET includes a source that is electrically coupled and mounted to a first portion of the flange extending outside the slot. The gate electrode of the vertical power MOSFET is electrically coupled and mounted to a first end of the gate electrode strip line.

A packaged power transistor may also include a device package having gate and drain terminals and an electrically conductive housing that operates as a source terminal. An electrically conductive plate may be mounted to the electrically conductive housing and a ceramic insulating layer may extend on a surface of the electrically conductive plate. According to a preferred aspect of this embodiment, a gate electrode strip line is provided that extends on the ceramic insulating layer and opposite the electrically conductive plate. A vertical power MOSFET is also provided having a source electrode electrically coupled to the electrically conductive plate and a gate electrode electrically coupled to a first end of the gate electrode strip line. A first electrical connector is also mounted at a first end to the drain terminal of the device package and at a second end to a drain electrode of the vertical power MOSFET. A second electrical connector is also provided. The second electrical connector is mounted to the gate terminal of the device package and to a second end of the gate electrode strip line.

Vertical power devices according to still further embodiments of the present invention include a semiconductor substrate having a drift region of first conductivity type therein extending adjacent a first face thereof. First and second stripe-shaped trenches are provided that extend in parallel and in a first direction across the semiconductor substrate. These trenches are spaced close to each other in order to provide a high degree of charge coupling to an active portion of the substrate. These first and second stripe-shaped trenches are filled with first and second insulated source electrodes. First and second base regions are provided along the length of the first and second trenches. The first and second base regions extend from a sidewall of the first trench to an opposing sidewall of the second trench. First and second source regions are also provided in the first and second base regions, respectively. An insulated gate electrode is provided on the substrate and this gate electrode extends in a second direction across the substrate. The second direction may be orthogonal to the first direction, so that during forward on-state conduction, majority carriers provided by the first and second source regions flow across the first and second base regions in a direction parallel to the closely spaced first and second stripe-shaped trenches.

Additional power devices may also include a semiconductor substrate having a drift region of first conductivity type therein and first and second stripe-shaped trenches that extend in the semiconductor substrate and define a drift region mesa therebetween. First and second insulated source electrodes are also provided in the first and second stripe-shaped trenches, respectively. In addition, a UMOSFET, comprising a third trench that is shallower than the first and second stripe-shaped trenches, is provided in the drift region mesa. This third trench extends between opposing sidewalls of the first and second stripe-shaped trenches. This UMOSFET may also comprise a transition region that defines rectifying and nonrectifying junctions with the base and drift regions, respectively. Base shielding regions may also be provided. These base shielding regions are preferably self-aligned with the opposing sidewalls of the first and second stripe-shaped trenches.

Methods of forming vertical power devices may also include forming first and second deep trenches in a semiconductor substrate having a drift region of first conductivity type therein. This drift region extends into a mesa defined between first and second opposing sidewalls of the first and second deep trenches, respectively. A UMOSFET is formed in the mesa, preferably along with first- and second base shielding regions of second conductivity type. These first and second base shielding regions extend into the mesa and are self-aligned with the first and second opposing sidewalls. A step may also be performed to form a transition region of first conductivity type that extends between the drift region and a base region of second conductivity type within the UMOSFET.

In particular, these methods may include implanting base region dopants of second conductivity type into an active portion of a semiconductor substrate having a drift region of first conductivity type therein and then forming a first mask having openings therein on the active portion of the semiconductor substrate. Shielding region dopants of second conductivity type are then implanted into the active portion of the substrate, using the first mask as an implant mask. A step is then performed to drive-in the implanted base and shielding region dopants to define a base region and a plurality of base shielding regions that extend laterally underneath the first mask and vertically through the base region and into the drift region. First and second deep trenches are then etched into the semiconductor substrate to define a drift region mesa therebetween. This etching step is performed using the first mask as an etching mask. First and second insulated source electrodes are then formed in the first and second trenches, respectively. Source region dopants of first conductivity type are implanted into the drift region mesa. These implanted source region dopants are driven-in to define a source region in the base region. A shallow trench is then formed in the drift region mesa. The shallow trench has a sidewall extending adjacent the base and source regions. An insulated gate electrode is formed in the shallow trench and a source electrode is formed that electrically connects the first and second insulated source electrodes, the source region and the base region together.

BRIEF DESCRIPTION OF THE DRAWINGS

FIGS. 1A–1F are top down plan views of an integrated vertical power device at intermediate stages of processing, according to preferred embodiments of the present invention.

FIG. 10A is a plan view of a supporting substrate according to an embodiment of the present invention.

FIG. 10B is a cross-sectional view of the substrate of FIG. 10A, taking along line 10B–10B'.

FIG. 11A is a plan view of a supporting substrate according to an embodiment of the present invention.

FIG. 11B is a cross-sectional view of the substrate of FIG. 11A, taking along line 11B–11B'.

DESCRIPTION OF PREFERRED EMBODIMENTS

Figure 1A:
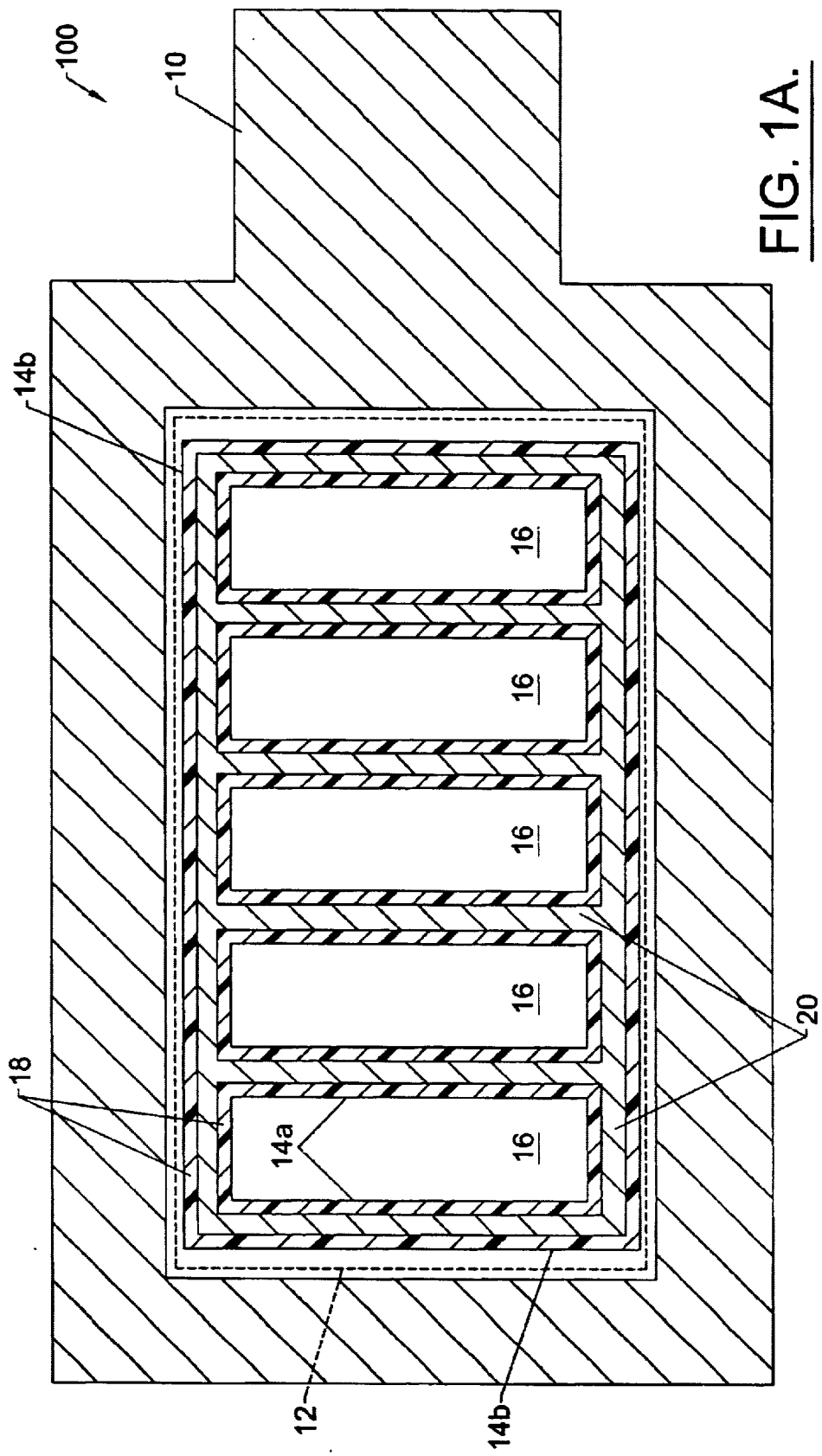

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Moreover, the terms "first conductivity type" and "second conductivity type" refer to opposite conductivity types such as N or P-type, however, each embodiment described and illustrated herein includes its complementary embodiment as well. Like numbers refer to like elements throughout.

Referring now to FIGS. 1A–1F and 2, methods of forming integrated vertical power devices according to first embodiments of the present invention will be described. In particular, FIG. 1A illustrates a top down plan view of a vertical power device 100 at an early stage of fabrication. This power device 100 is defined by an active portion 12 of a semiconductor substrate 50 and a surrounding electrically insulating layer 44 that may be formed as a field oxide isolation layer having a thickness of about 500 nm (5000 Å). The power device 100 also includes a preferred Faraday shield layer 10 that extends outside a perimeter of the active portion 12 of the substrate 50. The Faraday shield layer 10 may be formed as a highly doped polysilicon layer of first conductivity type (e.g., N+) on an upper surface of the surrounding electrically insulating layer 44. Among other things, the Faraday shield layer 10 acts as a field plate that provides edge termination to the active portion 12 of the substrate 50. Within the active portion 12 of the substrate 50, a plurality of vertical field effect transistor unit cells may be provided side-by-side. In one exemplary embodiment of a multi-celled vertical field effect transistor, the perimeter of the active portion 12 of the substrate 50 is defined by an outer sidewall 14b of a ladder-shaped trench. Other configurations of vertical power devices and unit cells may also be provided, as described more fully hereinbelow. The inner sidewalls 14a of the ladder-shaped trench define a plurality of stripe-shaped semiconductor mesas 16 that extend to an upper surface of the substrate 50. These semiconductor mesas 16 define the forward on-state current path of the vertical power device 100 and each mesa 16 may be associated with a respective unit cell of the power device 100. Thus, in the vertical power device 100 of FIG. 1A, five (5) unit cells are illustrated. A drift region of first conductivity type also extends into each of the semiconductor mesas 16. The doping profile of the drift region may be nonuniform (e.g., linear graded) in a vertical direction.

Figure 13:
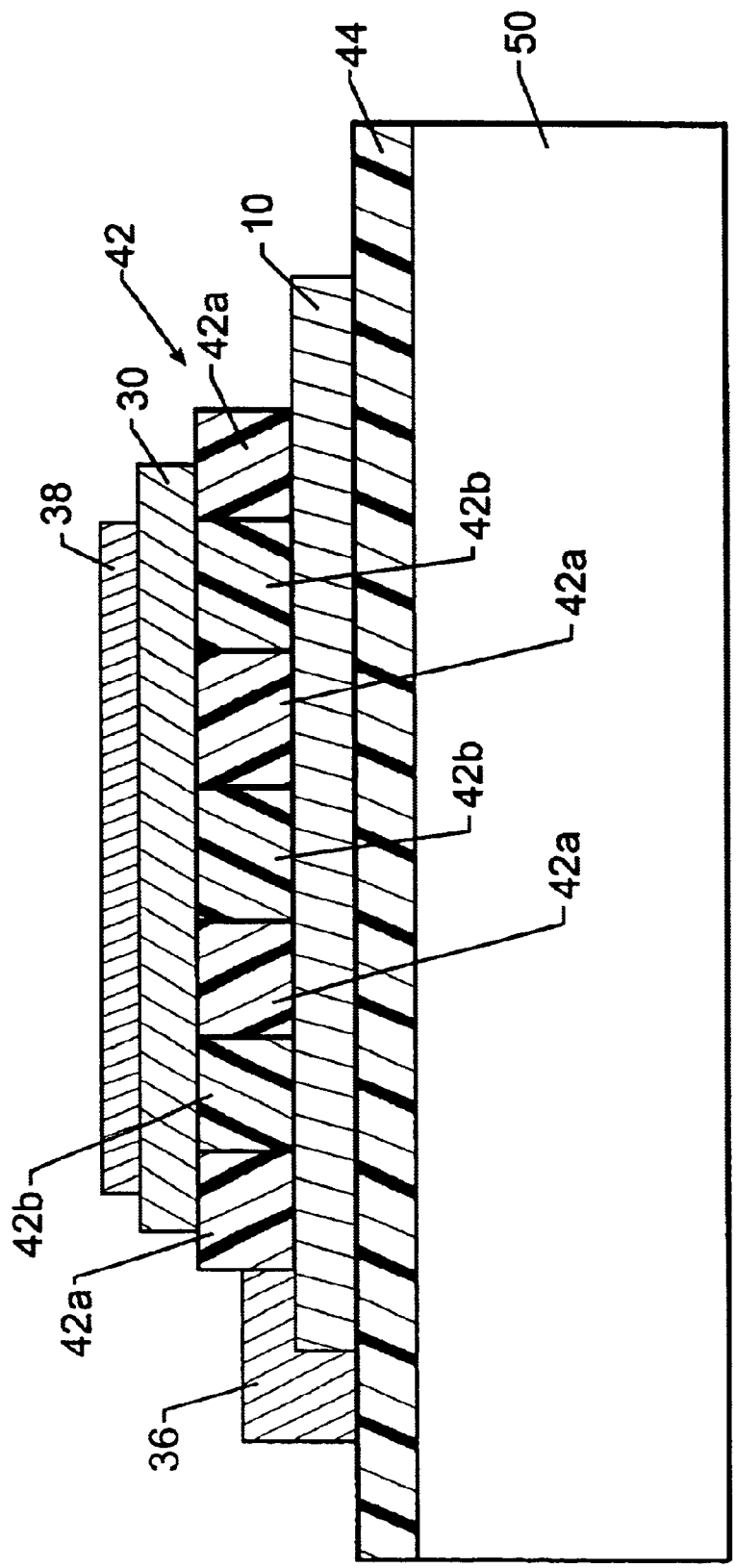
FIG. 13 is a cross-sectional view of the vertical power device of FIG. 1F, taken along line 2–2', having an intermediate electrically insulating layer that comprises strong breakdown regions and weak breakdown regions.

The sidewalls 14a–14b and bottom of the ladder-shaped trench are lined with an electrically insulating layer 18 (e.g., oxide) and a trench-based electrode 20 is provided on the lined sidewalls, as illustrated. The trench-based electrode 20 may comprise highly doped polysilicon. The steps to line the sidewalls 14a–14b and bottom of the trench with an electrically insulating layer 18 may be conventional. For example, after the ladder-shaped trench is selectively etched into the substrate 50, a blanket electrically insulating layer 18 may be conformally deposited on the surface of the mesas and on the exposed bottom and sidewalls of the trench. A blanket polysilicon layer (e.g., N+ polysilicon) may then be deposited on the substrate 50 and into the trench. A selective etch back step may then be performed using a mask to define an insulated ladder-shaped electrode 20 in the trench and a Faraday shield layer 10 extending around a periphery of the active portion 12 of the substrate 50, as illustrated. The selective etch back step may also result in the exposure of the semiconductor mesas 16 at the upper surface of the substrate 50. A blanket intermediate electrically insulating layer 42 may then be deposited on the Faraday shield layer 10 and on the active portion 12 of the substrate, using conventional techniques such as chemical vapor deposition (CVD). The intermediate electrically insulating layer 42 may comprise a dielectric material selected from the group consisting of silicon dioxide and silicon nitride, for example. The intermediate electrically insulating layer 42 may have a thickness in a range between about 500 nm (5000 Å) and 1000 nm (10,000 Å). As described more fully hereinbelow with respect to FIG. 13, the intermediate electrically insulating layer 42 may be patterned and comprise materials that enable it to perform an electrostatic discharge protection (ESD) function.

Figure 1B:
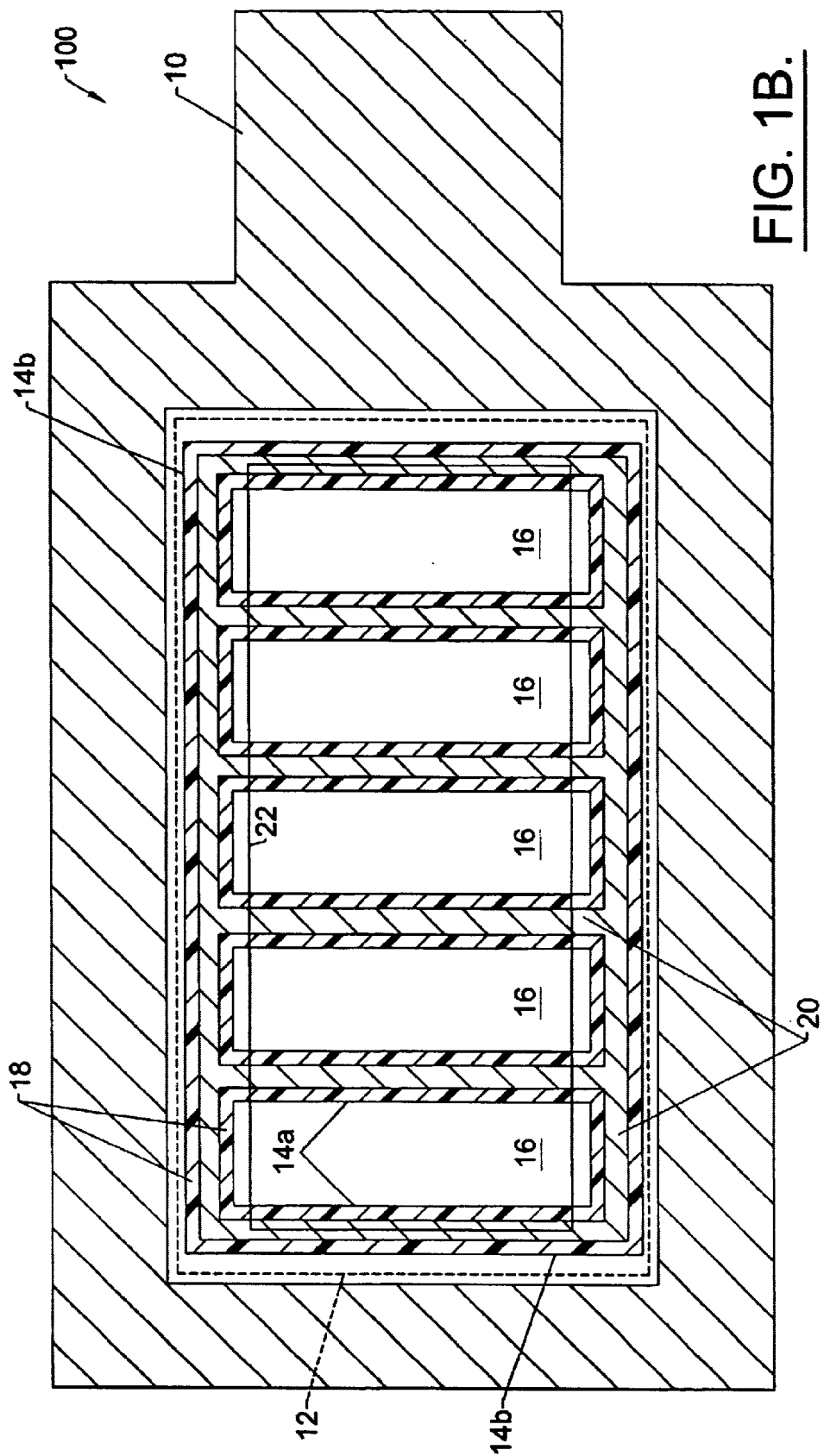
Figure 1C:
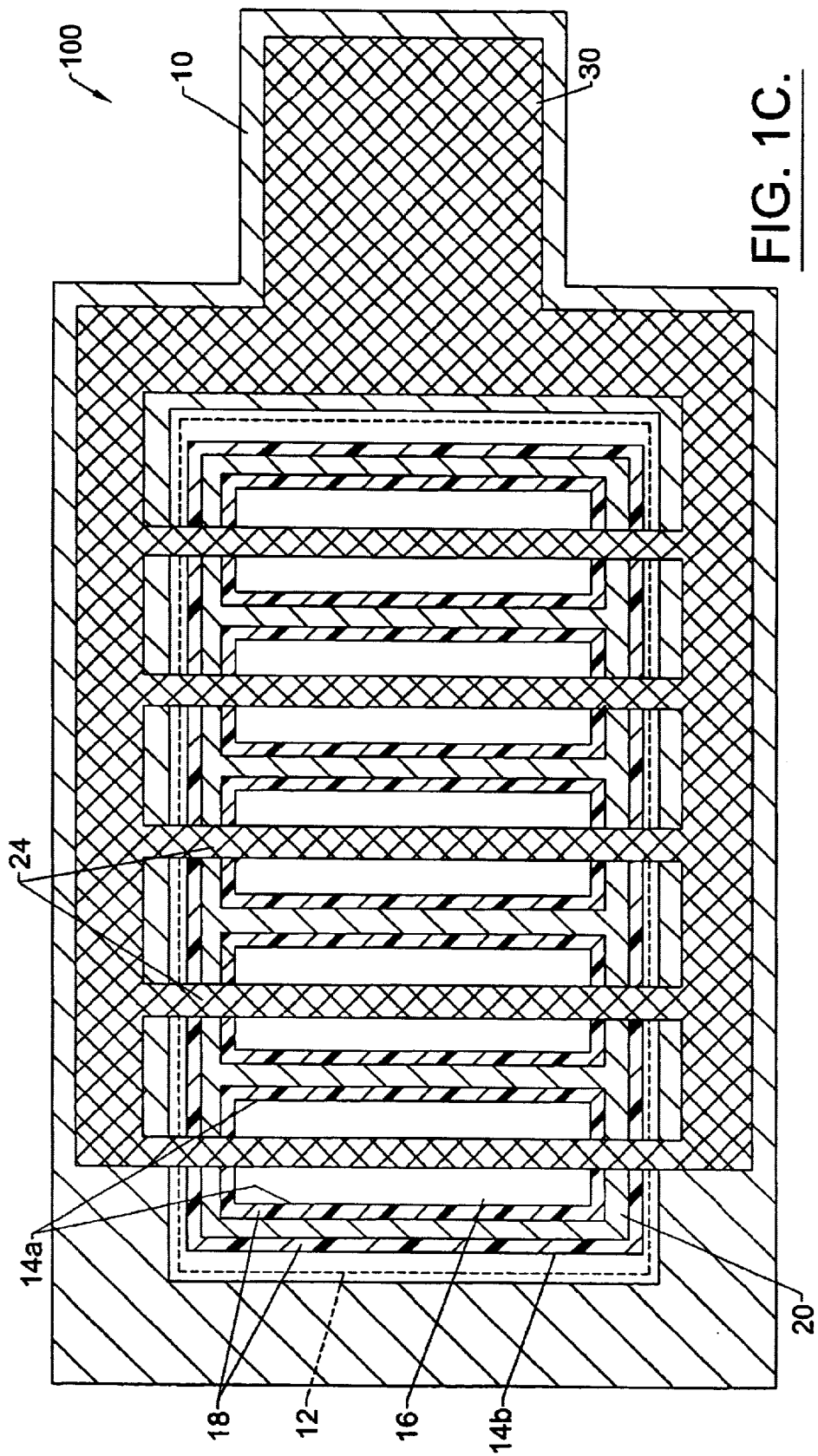

As illustrated by FIG. 1B, an etching mask 22 having an opening therein may be defined on the substrate 50 using conventional mask deposition and patterning techniques. The opening in the etching mask 22 is defined so that the deposited intermediate electrically insulating layer 42 covering the mesas 16 may be selectively removed to expose the surface of the substrate 50 (e.g., upper surfaces of the mesas 16) in the active portion 12. Referring now to FIG. 1C, steps may be undertaken to define a gate oxide insulating layer (not shown) on upper exposed surfaces of the mesas 16. A layer of highly conductive material (e.g., N+ polysilicon) may then be deposited and patterned on the gate oxide insulating layer to define a plurality of parallel stripe-shaped gates 24 that extend within the active portion 12 of the substrate 50. Each of these gates 24 is associated with a respective unit cell and extends lengthwise across a respective stripe-shaped mesa 16. The opposite ends of the gates 24, which extend to the edges of the active portion 12 of the substrate 50, are electrically connected together by a gate electrode 30 that extends on the intermediate electrically insulating layer 42. According to preferred aspects of these first embodiments, the gate electrode 30 is patterned so that it extends outside the perimeter of the active portion 12 in a manner that at least substantially confines it to within an outer perimeter of the underlying Faraday shield layer 10. Base region dopants of second conductivity type (e.g., P-type) are then implanted into the mesas 16, using the stripe-shape gates 24 as a self-aligned base region implant mask. A thermal annealing step may then be performed to partially drive-in the implanted base region dopants.

Figure 1D:
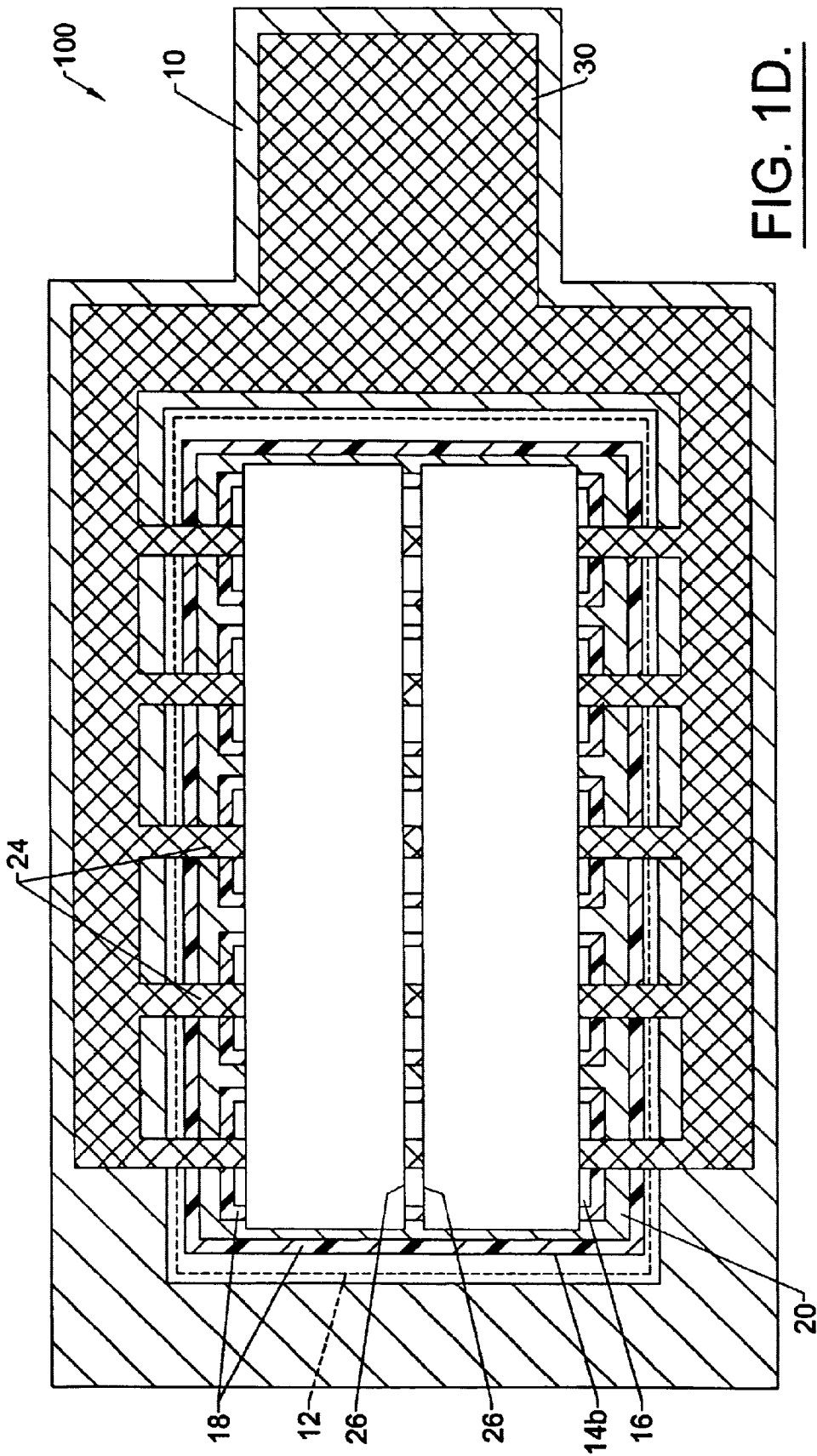

As illustrated by FIG. 1D, a source implant mask 26 is then patterned on the substrate 50. This is followed by the step of implanting source region dopants of first conductivity type into the exposed portions of the mesas 16, using the gates 24 again as a self-aligned source region implant mask. A second thermal annealing step may then be performed to drive-in the implanted base and source region dopants and thereby define base and source regions within each mesa 16. The space between the pair of openings in the source implant mask 26 is provided to define the locations of the ohmic contacts between the base regions and a subsequently formed source electrode 36.

Figure 1E:
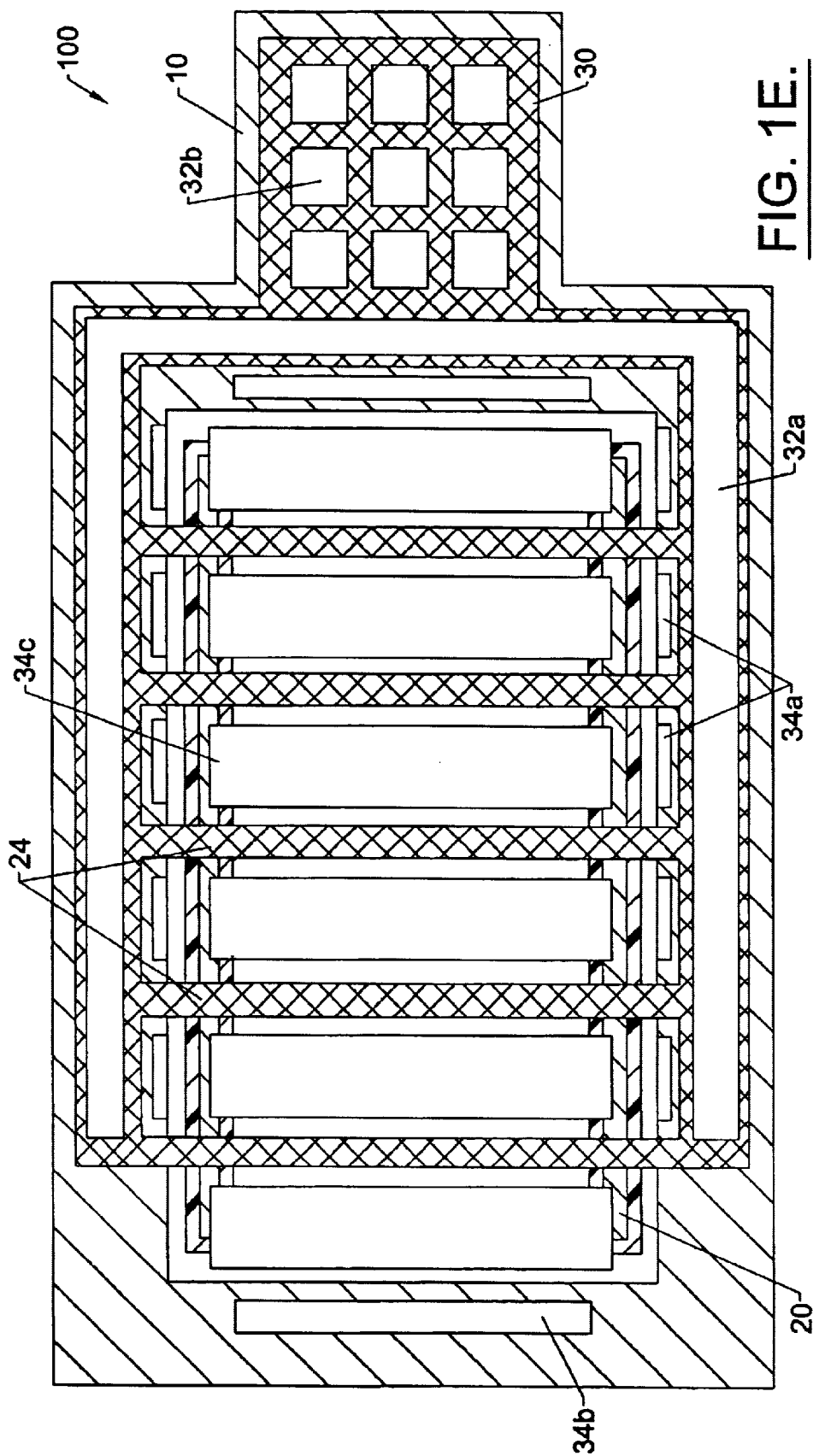
Figure 2:
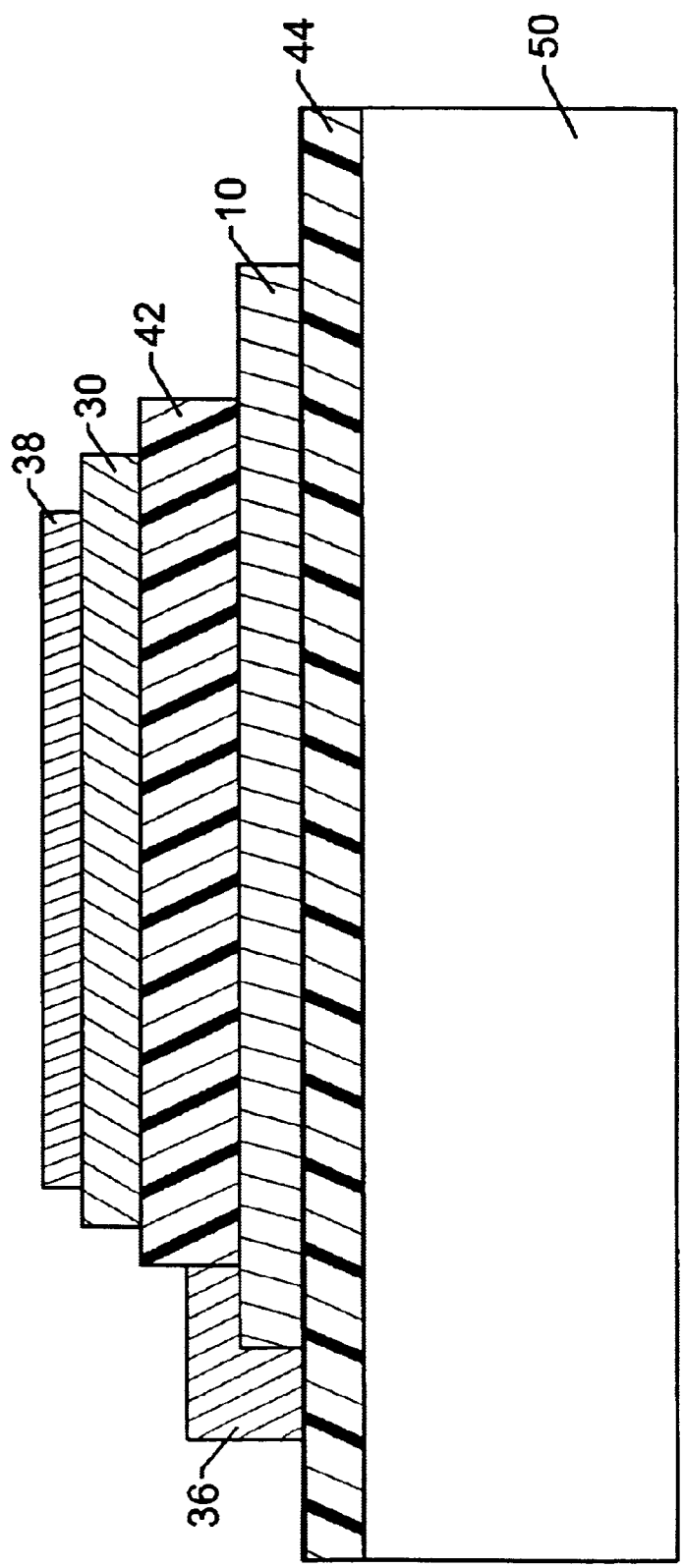
FIG. 2 is a cross-sectional view of the vertical power device of FIG. 1 F, taken along line 2–2'.

Referring now to FIG. 1E, at least one blanket electrically insulating passivation layer (not shown) is then formed on the substrate 50. Separate photolithographically defined masking steps may then be performed to define a plurality of source electrode contact openings 34a, 34b and 34c and a plurality of gate electrode contact openings 32a and 32b in the at least one passivation layer. A blanket layer of metallization may then be deposited on the substrate 50 and patterned to define a source electrode 36 and gate electrode contact 38. The patterned source electrode 36 extends into each of the source electrode contact openings 34a, 34b and 34c and electrically connects the source and base regions within each unit cell together and to the trench-based electrode 20 and the Faraday shield layer 10. The patterned gate electrode contact 38 extends into each of the gate electrode contact openings 32a and 32b and ohmically contacts the gate electrode 30.

The Faraday shield layer 10, which is held at the potential of the source electrode 36, operates to improve the high frequency switching performance of the device 100 by reducing the device's parasitic gate-to-drain capacitance (Cgd). As illustrated by FIGS. 1A–1F and 2, the Faraday shield layer 10 is provided between at least a first portion of the gate electrode 30 and a drain of the device 100, which typically extends adjacent a bottom surface of the substrate 50. It is preferred that the entire gate electrode 30 be at least substantially confined within an outer perimeter of the Faraday shield layer 10. The Faraday shield layer 10 operates to capacitively decouple at least the first portion of the gate electrode 30 from the drain. The thickness and material characteristics of the intermediate electrically insulating layer 42 influence the degree to which the parasitic gate-to-source capacitance of the device 100 is increased by the presence of the Faraday shield layer 10. Preferably, the thickness, layout and material characteristics of the intermediate insulating layer 42 are chosen so that any impairment in switching performance caused by an increase in parasitic gate-to-source capacitance is significantly outweighed by the improvement in switching performance achieved by the reduced parasitic gate-to-drain capacitance. An intermediate insulating layer 42 that is relatively thick and has a low dielectric constant can be used advantageously to reduce the parasitic gate-to-source capacitance. It is also preferred that the gate electrode 30 be sufficiently confined within the outer perimeter of the Faraday shield layer 10 that the total gate-to-drain capacitance (Cgd), including the capacitance attributed to the gates 24 within the active portion 12, be less than about 0.1 times a gate-to-drain capacitance of an otherwise equivalent integrated power device that omits the Faraday shield layer 10 and the intermediate electrically insulating 42 layer from between the gate electrode 30 and the underlying electrically insulating layer 44.

Figure 3:
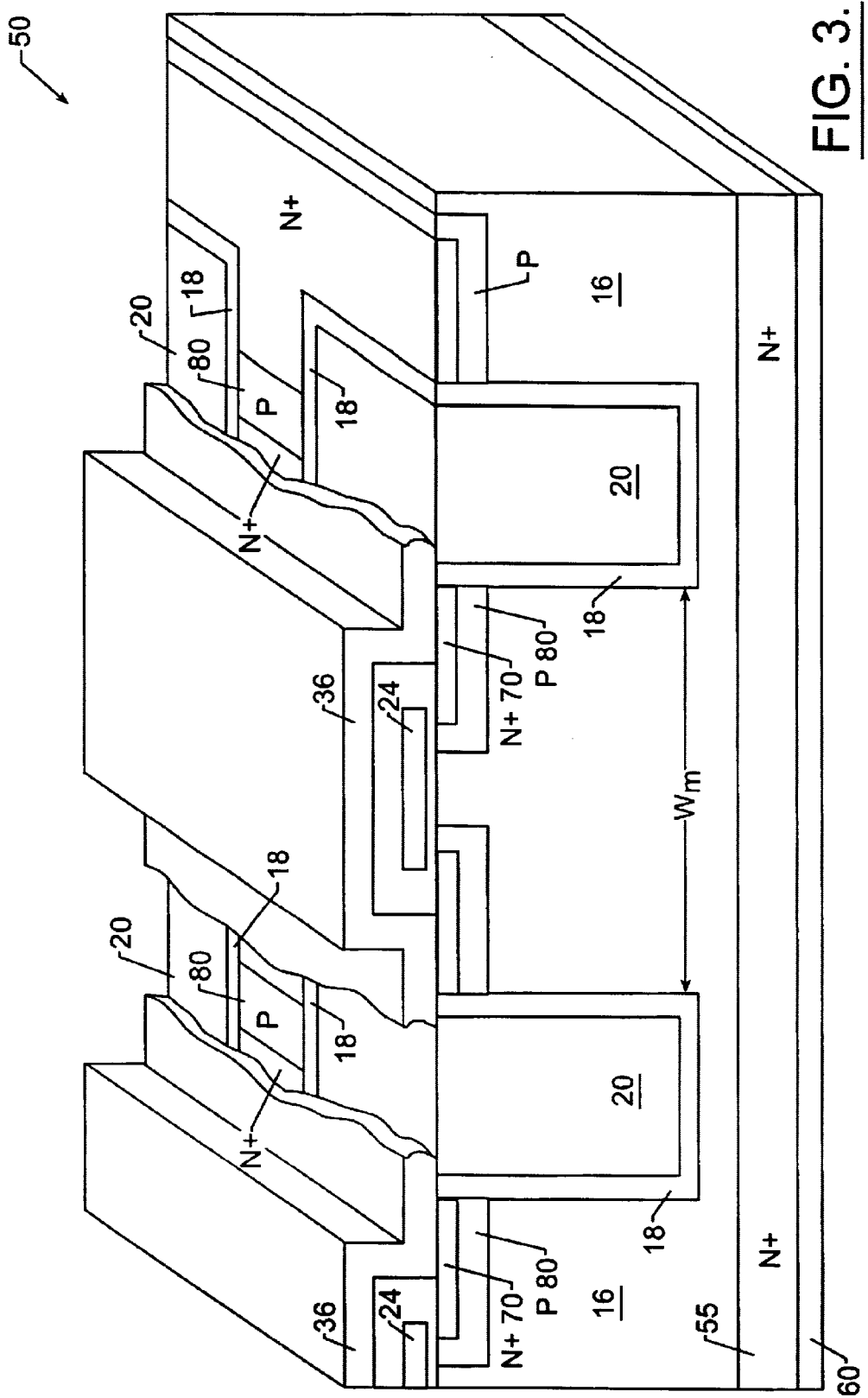
FIG. 3 is a three-dimensional perspective view of a unit cell of a vertical power device according to an embodiment of the present invention.

The vertical power device 100 of FIGS. 1A–1F may also utilize a plurality of unit cells within each mesa 16, with each mesa having a nonuniform width along its length and being defined on opposing sides by a plurality of discontinuous deep trenches. The use of discontinuous deep trench regions improves operating performance by, among other things, lowering specific on-state resistance (Rsp). Each of these unit cells may include a quad arrangement of trenches, as illustrated by FIG. 3. This quad arrangement of trenches extends to a uppermost surface of the semiconductor substrate 50 and defines a drift region mesa 16 therebetween (having a width "Wm" when viewed in transverse cross-section). A drain region 55 of first conductivity type (shown as N+) and drain electrode 60 are also provided adjacent a lowermost surface of the substrate 50. Base regions 80 of second conductivity type (e.g., P-type) are also provided that extend into the drift region mesa 16. Within each base region 80, a respective source region 70 (shown as N+) is provided. An insulated electrode 20 is provided in each of the trenches and the bottom and sidewalls of each trench are lined with a respective electrically insulating layer 18. These trench-based insulated electrodes 20 are electrically connected together and to each source region (and base region 80) by a source electrode 36 that preferably extends on the uppermost surface. An insulated gate 24 is also provided as a stripe-shaped conductive layer that extends lengthwise along the length of each drift region mesa 16 and links together multiple unit cells. The quad arrangement of trenches in each unit cell includes a first pair of trenches (left side and right side) at a front of the unit cell and a second pair of opposing trenches at a rear of the unit cell, when the device is viewed in transverse cross-section.

According to a preferred aspect of the illustrated unit cell, each source region 70 extends along the uppermost surface in a lengthwise direction from one end of a mesa to another end without interruption by the base region 80. Thus, during fabrication, the source implant mask 26 illustrated by FIG. 1D need not be defined to provide one or more openings that allow for direct surface contact between the base region 80 and the surface source electrode 36. This lack of interruption of the source region 70 by the base region 80 in the lengthwise direction increases the area of the on-state current path by maximizing a width of each inversion-layer channel associated with each base region in each unit cell during forward on-state conduction. Ohmic contact between the source electrode 36 and base region 80 is nonetheless made directly to the base region 80, which, as illustrated by FIG. 3, extends along the uppermost surface in the lengthwise direction from a rear sidewall of a trench in the front pair of trenches to an opposing sidewall of a trench in the rear pair of trenches. A Faraday shield layer 10 may also be provided that extends around an integrated vertical power device containing a plurality of the preferred unit cells illustrated by FIG. 3.

Figure 4:
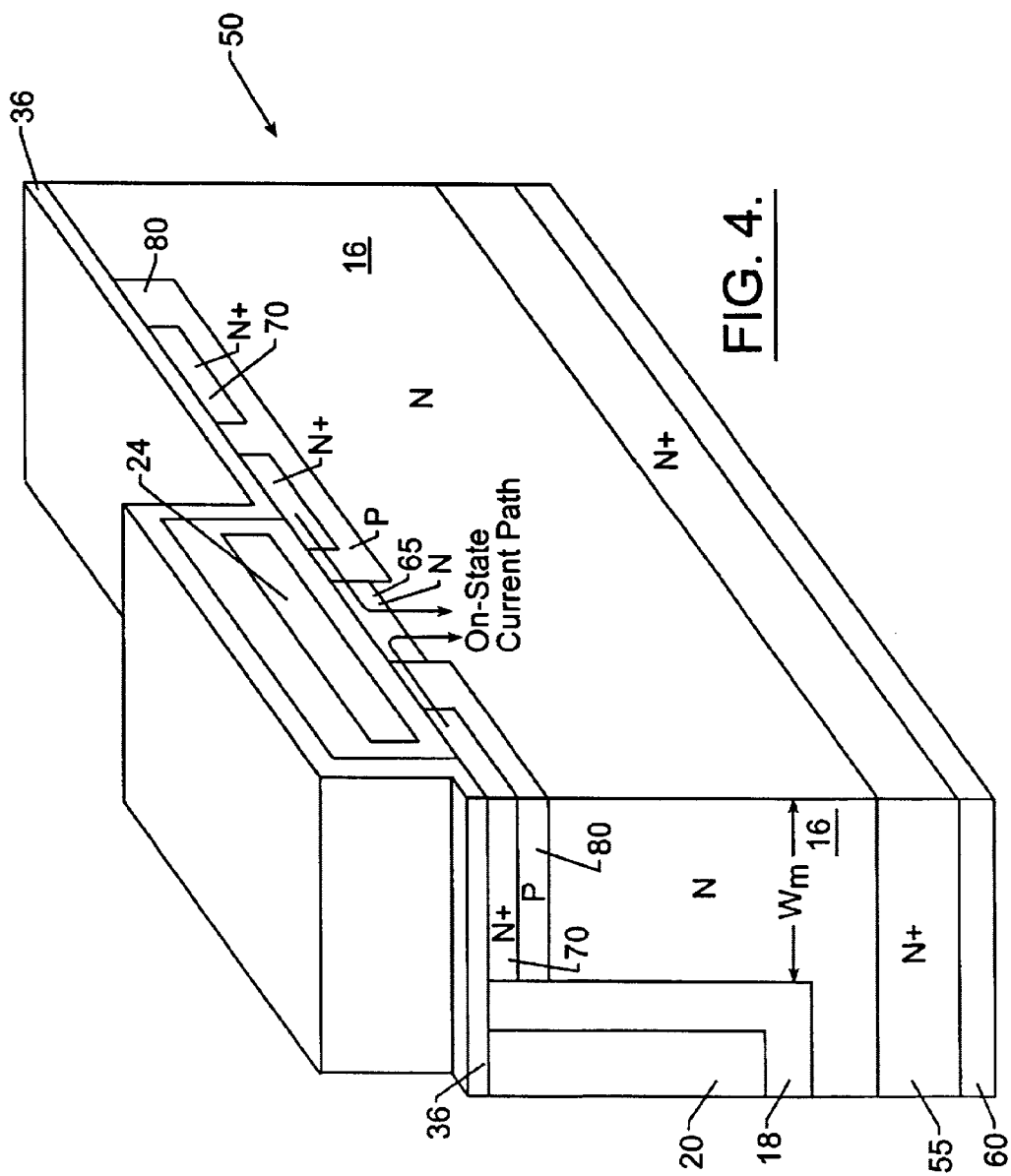
FIG. 4 is a three-dimensional perspective view of a half unit cell of a vertical power device according to another embodiment of the present invention.

Referring now to FIG. 4, a perspective view of a half unit cell of a vertical power device according to another embodiment of the present invention includes a trench-based electrode 20 that extends in a first lengthwise direction across a semiconductor substrate 50. The trench-based electrode 20 is insulated from a drift region mesa 16 of first conductivity type by an electrically insulating layer 18 that lines the sidewalls and bottom of each trench. The width of the drift region mesa 16 in the illustrated half unit cell is "½$W_m$". Each of the source regions 70 and base regions 80 extend laterally across a width of a respective drift region mesa 16, from a sidewall of one trench (left side) to a sidewall of an adjacent trench (right side, not shown). A plurality of base regions 80 are also provided along the length of each mesa 16 and are spaced side-by-side, as illustrated. Transition regions 65 of first conductivity type are also provided between adjacent base regions 80. The design, operation and advantages of using transition regions 65 are more fully described in U.S. application Ser. No. 09/833,132 to Baliga, entitled "Power Semiconductor Devices Having Retrograded-Doped Transition Regions that Enhance Breakdown Voltage Characteristics and Methods of Forming Same," filed Apr. 11, 2001, assigned to the present assignee, the disclosure of which is hereby incorporated herein by reference. The insulated gate electrodes 24 are also provided as stripe-shaped electrodes that preferably extend in a second direction across the substrate 50. As illustrated, the first direction may be orthogonal to the second direction. As illustrated by the arrows extending laterally and vertically across each transition region 65, during forward on-state conduction, majority carriers (e.g., electrons) initially flow laterally in the first direction parallel to the sidewalls of each trench. This lateral current flow occurs through a respective inversion-layer channel that extends across each base region 80. Like the device of FIG. 3, contact may be made directly between the source electrode 36 and each base region 80 within the device of FIG. 4, without interrupting the forward on-state current path by interrupting the source regions 70 that provide majority carriers during forward on-state conduction. The unit cell of FIG. 4 may also be advantageous from a fabrication standpoint because no critical alignment step is required when patterning the insulated gate electrodes 24 relative to the trenches to insure that each gate electrode 24 is centered about a respective drift region mesa 16. The device of FIG. 4 also allows for the formation of narrower drift region mesas 16 (i.e., smaller "$W_m$") between adjacent trenches, because each lateral on-state current path extends along the length of adjacent trenches instead of laterally across the width of a respective drift region mesa 16. This reduction in the widths of the drift region mesas 16 may improve device characteristics by increasing the degree of charge coupling between the trench-based electrodes 20 and the drift region mesas 16.

Figure 5:
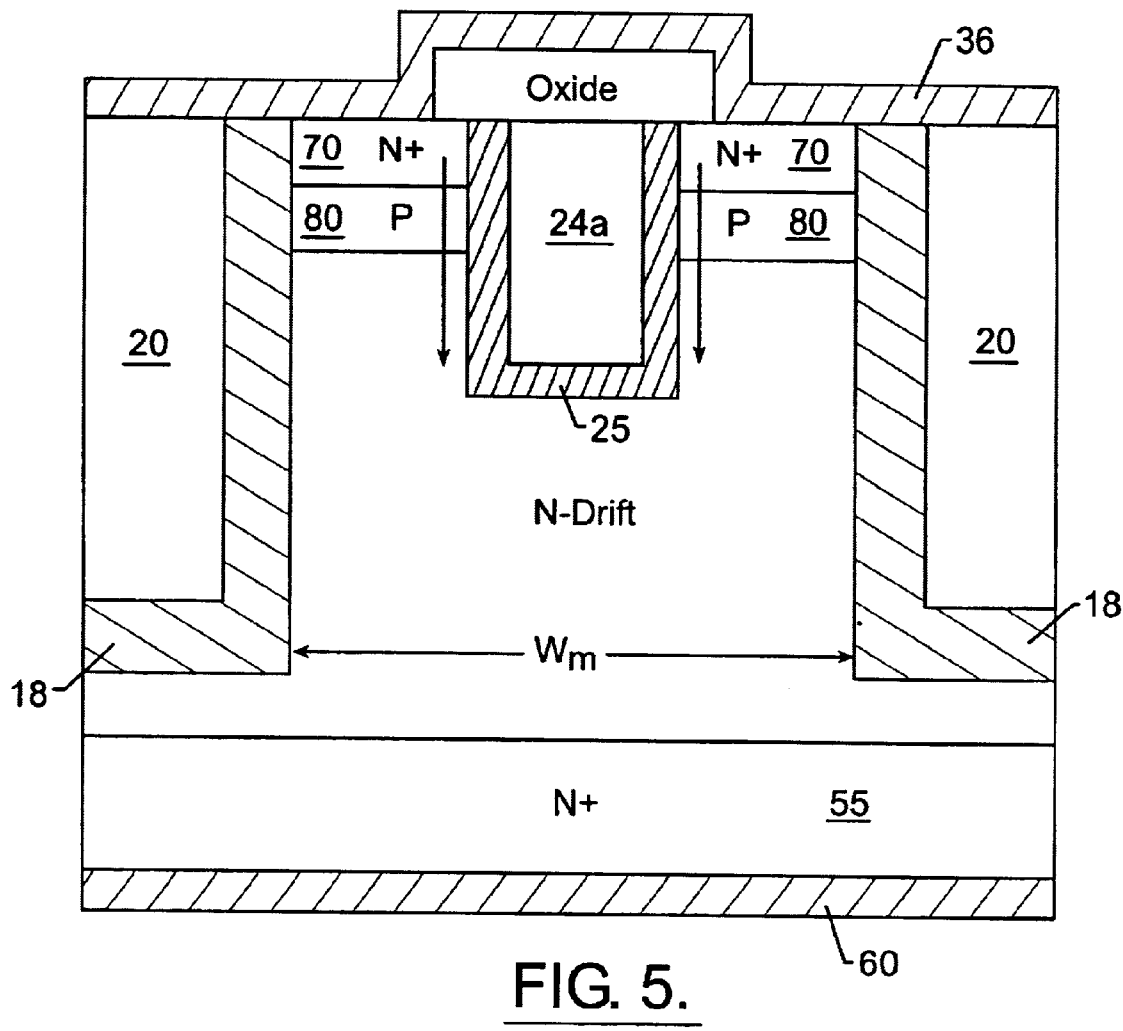
FIG. 5 is a cross-sectional view of a power device according to still an embodiment of the present invention.

FIG. 5 is a transverse cross-sectional view of a unit cell of a vertical power device (i.e., UMOSFET) that utilizes a relatively shallow trench-based insulated gate electrode 24a and relatively deep trench-based insulated electrodes 20 to provide high degrees of charge coupling to those portions of the drift region mesa 16 (having width $W_m$) that extend between adjacent deep trenches. Each gate electrode 24a is separated from a respective drift region mesa 16 by a gate insulating layer 25. The drift region mesa 16 may be nonuniformly doped (e.g., linear graded). The electrodes 20 within each of the deep trenches are separated from the drift region mesa 16 by an electrically insulating layer 18. Control of forward on-state current to a center of the drift region mesa 16 is provided by the trench-based insulated gate electrode 24a. In particular, application of a gate bias of sufficient magnitude to the insulated gate electrode 24a will cause the formation of a vertical inversion-layer channel within each base region 80. As illustrated by the arrows, majority carriers (e.g., electrons) are provided from the source regions 70 to the drift region mesa 16 during forward on-state conduction. The majority carriers are provided by inversion-layer channels that extend along the opposite sidewalls of the relatively shallow central trench. This gate bias may also reduce forward on-state resistance by causing the formation of a highly conductive accumulation layer (not shown) at the bottom and lower sidewalls of the relatively shallow trench.

In addition to each of the above-described power device embodiments that may utilize Faraday shield layers to reduce parasitic gate-to-drain capacitance, additional vertical power device embodiments may also incorporate one or more aspects of the preferred embodiments described herein. Such additional vertical power device embodiments include those described in U.S. application Ser. No. 09/602,414 to Baliga, entitled "MOSFET Devices Having Linear Transfer Characteristics When Operating in Velocity Saturation Mode," filed Jun. 23, 2000, assigned to the present assignee, the disclosure of which is hereby incorporated herein by reference. Still further power device embodiments are also described in U.S. Pat. Nos. 5,998,833 and 6,191,447 to Baliga, the disclosures of which are hereby incorporated herein by reference.

Figure 6:
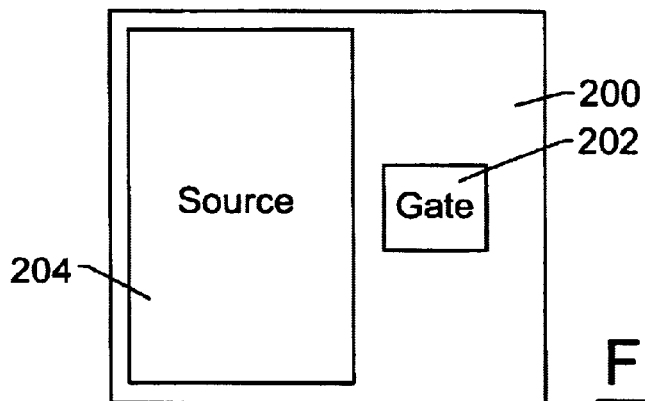
FIG. 6 is a plan view of a power device having source and gate contacts on a surface thereof.
Figure 7:
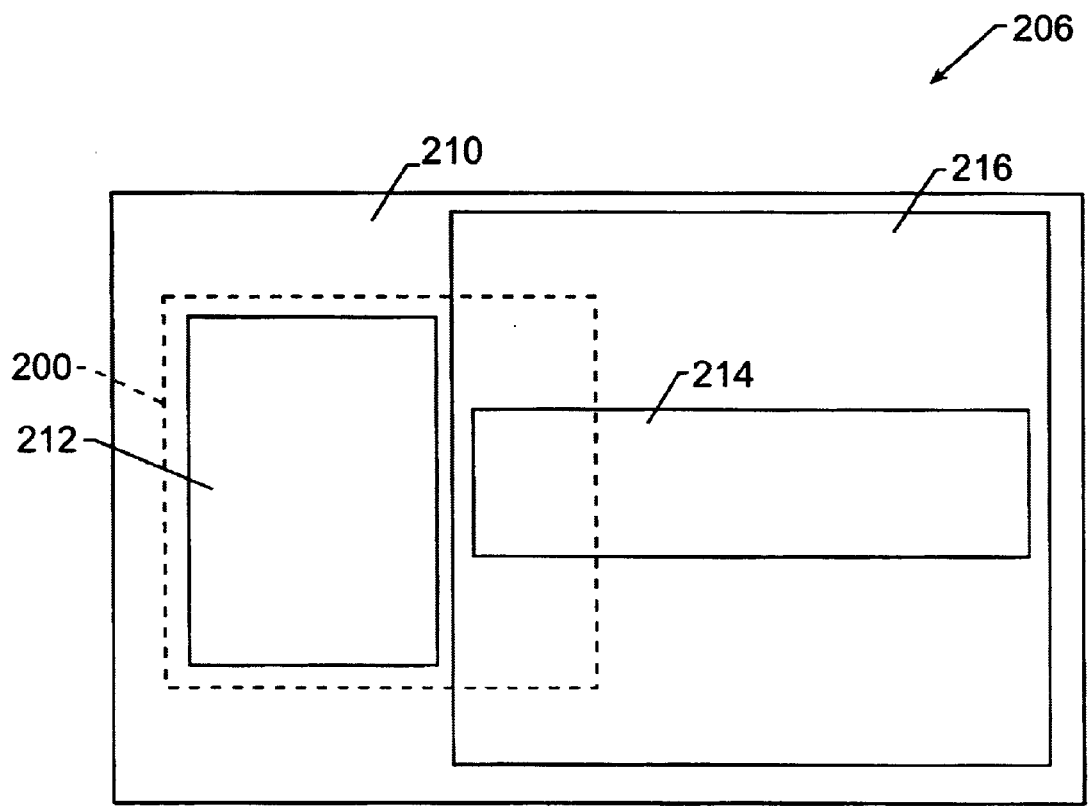
FIG. 7 is a plan view of a supporting substrate according to an embodiment of the present invention.
Figure 8:
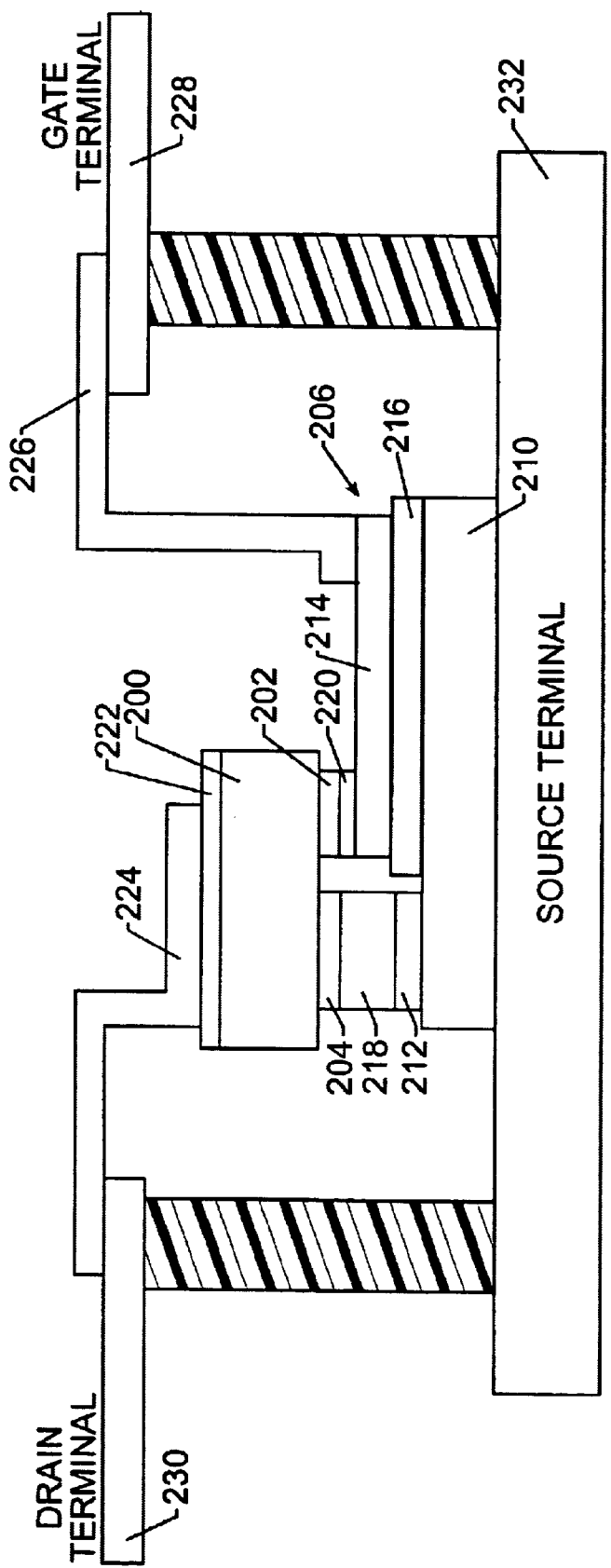
FIG. 8 is a side view of a packaged power device that receives the supporting substrate of FIG. 7, according to an embodiment of the present invention.

As illustrated by FIGS. 6–8, vertical power devices, including those described above, may be packaged and utilized as RF power MOSFETs using preferred packaging sub-assemblies as described herein. In particular, FIG. 6 is a plan view of a silicon chip 200 containing at least one vertical power device according to an embodiment of the present invention or conventional design. The illustrated vertical power device includes a gate electrode contact 202 and a source electrode 204. An opposite side of the silicon chip 200 may include a drain electrode 222. FIG. 7 is a plan view of a supporting substrate 206 to which the silicon chip 200 of FIG. 6 can be mounted when the power device is used in an RF power application. FIG. 8 is a cross-sectional view of a packaged device that includes the vertical power device of FIG. 6 and the supporting substrate 206 of FIG. 7, according to an embodiment of the present invention. As illustrated by these figures, the packaged device includes a supporting substrate 206. The supporting substrate 206 comprises an electrically conductive plate 210 (e.g., copper plate) and a ceramic insulating layer 216 attached to an upper surface of the electrically conductive plate 210. A gate electrode strip line 214 is also provided on the ceramic insulating layer 216 so that a distributed R-C network can be provided at an input of the power device. Source contact metallization 212 (e.g., die attach metal) may also be provided on the electrically conductive plate 210. As illustrated by FIG. 8, a source solder bond 218 provides a direct electrical and mechanical connection between the source contact metallization 212 and the source electrode 204 of the power device. The source solder bond 218 should- be appropriately sized to provide a sufficient heat sink to the source electrode 204 of the power device. A gate solder bond 220 provides a direct electrical and mechanical connection between one end of the gate electrode strip line 214 and the gate electrode contact 202 of the power device. The properties of the distributed R-C network can be designed by choosing the shape of the gate strip line 214 and the dielectric properties of the ceramic or other dielectric insulating layer 216 to achieve a desired impedance transformation suitable for RF applications. The use of a gate electrode strip line 214 eliminates the need for a large number of wire bonds and improves the precision of the input matching network because the shape of the gate stripe line metal can be accurately controlled using conventional thin film technology. The width of the gate electrode strip line 214 is also preferably less than about 0.2 times a width of the ceramic insulating layer 216 when viewed in transverse cross-section. A ratio of the width of the gate electrode strip line 214 to the thickness of the dielectric insulating layer 216 may be set at a range from between about 2 (for dielectrics having an $\in_r$ of about 10) and 4 (for dielectrics having an $\in_r$ of about 4).

As further illustrated by FIG. 8, the device package also includes a gate terminal 228, a drain terminal 230 and an electrically conductive flange 232 that operates as a source terminal. The electrically conductive plate 210 is mounted (e.g., soldered) to the electrically conductive flange 232. A first electrical connector 224 is also mounted between the drain terminal 230 of the device package and the drain electrode 222 of the power device. This first electrical connector 224 may comprise a wire bond or metal plate, for example. A second electrical connector 226 is also mounted between the gate terminal 228 of the device package and a second end of the gate electrode strip line 214. Based on this arrangement of connecting elements, preferred RF matching and impedance transformation characteristics can be achieved and heat generated within the body of the power device may be efficiently removed through the mechanical and electrical connection provided between the source electrode 204, source solder bond 218, source contact metallization 212 and conductive plate 210. The solder bond may comprise gold (Au) or other bonding material suitable for RF applications.

Figure 9:
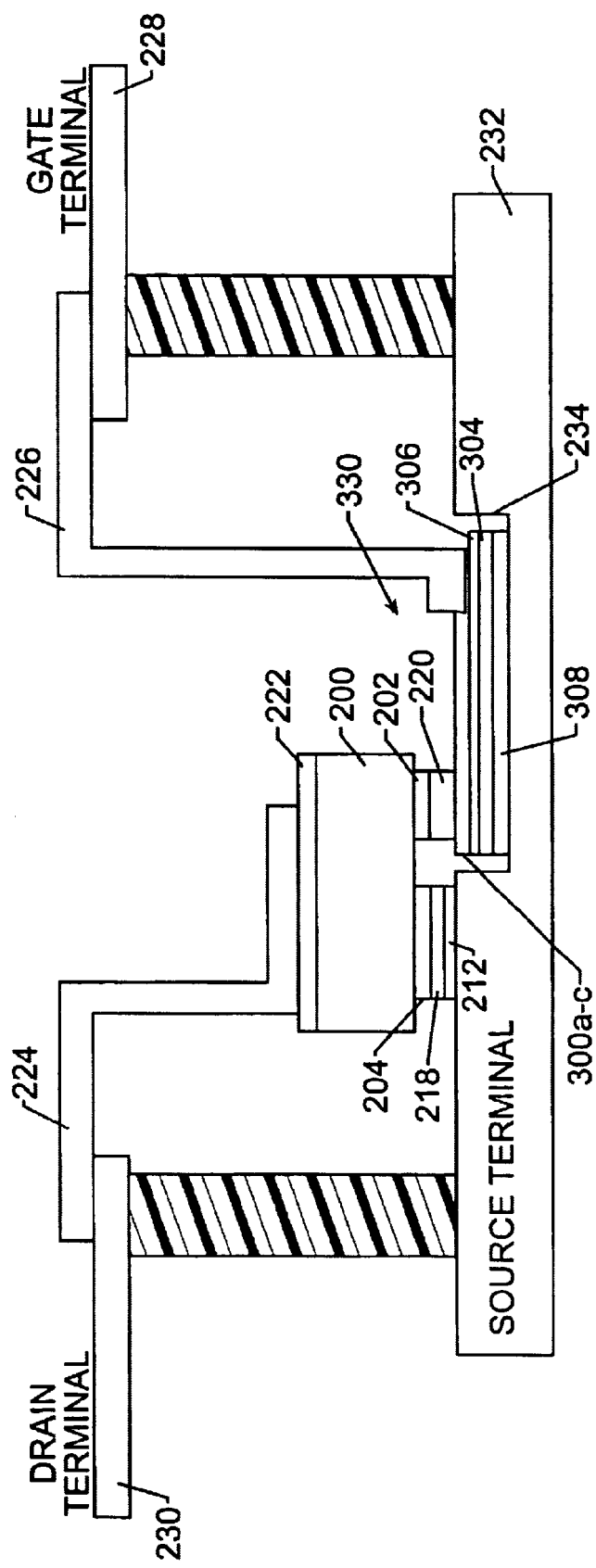
FIG. 9 is a side view of a packaged power device according to an embodiment of the present invention.

Packaged power devices according to still further embodiments of the present invention are illustrated by FIGS. 9, 10A–10B and 11A–11B. In particular, FIG. 9 illustrates a packaged power device that is similar to the packaged power device of FIG. 8, however, an electrically conductive flange 232 is provided having at least one slot 234 therein. Additional slots may also be provided for receiving additional matching components (e.g., output matching circuitry). A preferred supporting substrate 330 is provided in the slot 234. Preferred supporting substrates 330 (shown as 330A and 330B in FIGS. 10A–10B and 11A–11B) are similar to the supporting substrate 206 of FIG. 8. The supporting substrate 330A of FIGS. 10A–10B includes an electrically conductive substrate 304 (e.g., N+ silicon substrate, copper plate) that is mechanically and electrically connected to a bottom of the slot 234 by a layer of contact metallization 308. A dielectric layer 306 is provided on the electrically conductive substrate 304. In another embodiment, the dielectric layer 306 and electrically conductive substrate 304 may take the form of a ceramic substrate. A gate electrode strip line 300a is also patterned on the dielectric layer 306. The gate electrode strip line 300a preferably comprises a highly conductive material, such as gold (Au). As illustrated best by FIG. 9, a first end of the gate electrode strip line 300a is electrically and mechanically connected to a gate electrode contact 202 by a gate solder bond 220 and a second end of the gate electrode strip line 300a is electrically connected to a second electrical connector 226. An electrically insulating passivation layer 302 is also provided on the gate electrode strip line 300a. The electrically insulating passivation layer 302 has openings therein that expose the ends of the gate electrode strip line 300a. The supporting substrate 330B of FIGS. 11A–11B is similar to the supporting substrate 330A of FIGS. 10A–10B, however, the gate electrode strip line includes first and second strip line segments 300b and 300c that are joined by a capacitor. This capacitor may be a MOS capacitor and may comprise a first conductive layer 314 (e.g., polysilicon), an insulating layer 316 (e.g., oxide) and an underlying conductive layer that is defined by the electrically conductive substrate 304.

Figure 12:
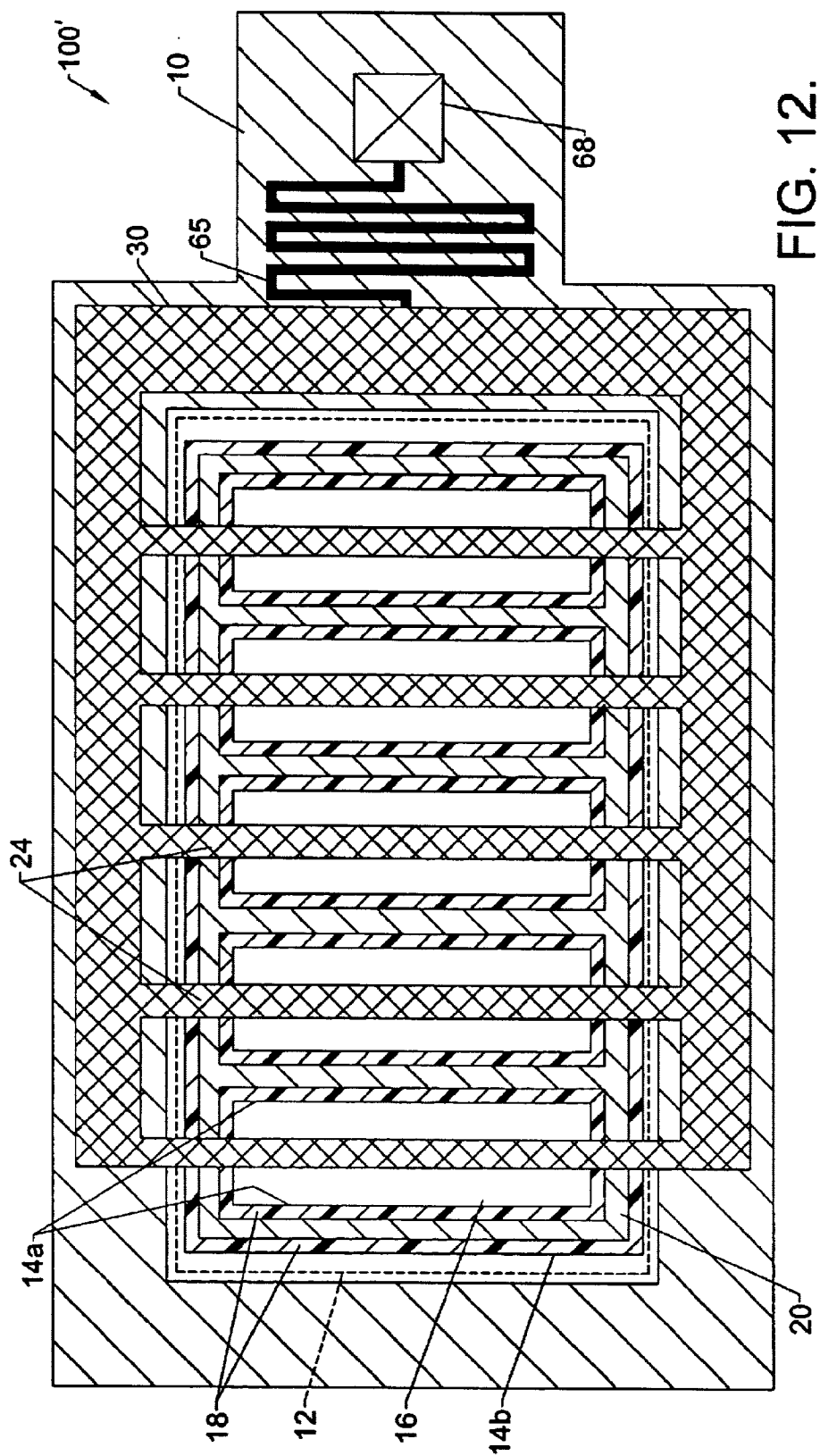
FIG. 12 is a top down plan view of an integrated vertical power device having a gate electrode strip line integrated therein.

The device embodiments illustrated by FIGS. 1A–1F and 2 may also integrate impedance transformation of the same chip as the power device to achieve preferred impedance matching when packaged and used in an RF application. In particular, FIG. 12 illustrates a power device 100' at an intermediate stage of fabrication that is similar to the device of FIG. 1C. However, in contrast to the device of FIG. 1C, a gate electrode strip line 65 is provided on the Faraday shield layer 10 and is separated therefrom by the intermediate electrically insulating layer 42. The gate electrode strip line 65 has first and second opposing ends that are electrically connected to the gate electrode 30 and gate pad 68, as illustrated.

According to other aspects of the preferred power devices, the intermediate electrically insulating layer 42 may be designed to provide electrostatic discharge (ESD) protection. In particular, the intermediate electrically insulating layer 42 may be designed so that the maximum breakdown voltage that the intermediate electrically insulating layer 42 (or regions therein) can support is less than the maximum breakdown voltage that the gate insulator (e.g., gate oxide) can support between the gate(s) 24 and base region of the power device 100. To provide this ESD capability, the intermediate electrically insulating layer 42 preferably comprises a plurality of regions 42a and 42b of different electrically insulating materials having different breakdown voltage characteristics. These regions 42a and 42b may be spaced side-by-side relative to each other. In particular, some of the electrically insulating regions 42a within the intermediate electrically insulating layer 42 may comprise materials that can support high breakdown voltages but preferably have relatively low dielectric constants (to reduce parasitic gate-to-source capacitance) and other insulating regions 42b within the intermediate electrically insulating layer 42 may comprise materials that can only support relatively low breakdown voltages (compared to the maximum breakdown voltage of the gate insulator). The electrically insulating regions that can support relatively high and relatively low breakdown voltages will be referred to herein as strong breakdown regions and weak breakdown regions, respectively. The weak breakdown regions 42b, which experience breakdown first in response to excessive voltage spikes that may be caused by ESD events, provide an electrical path for ESD current that is outside the active portion 12 of the power device 100. These weak breakdown regions 42b may comprise zinc oxide (ZnO). According to these aspects, the gate electrode (and/or gate pad), the weak breakdown regions 42b and the Faraday shield layer 10 collectively form a metal oxide varistor (MOV). The weak breakdown regions 42b may also comprise intrinsic or P-type polycrystalline silicon.

Figure 14A:
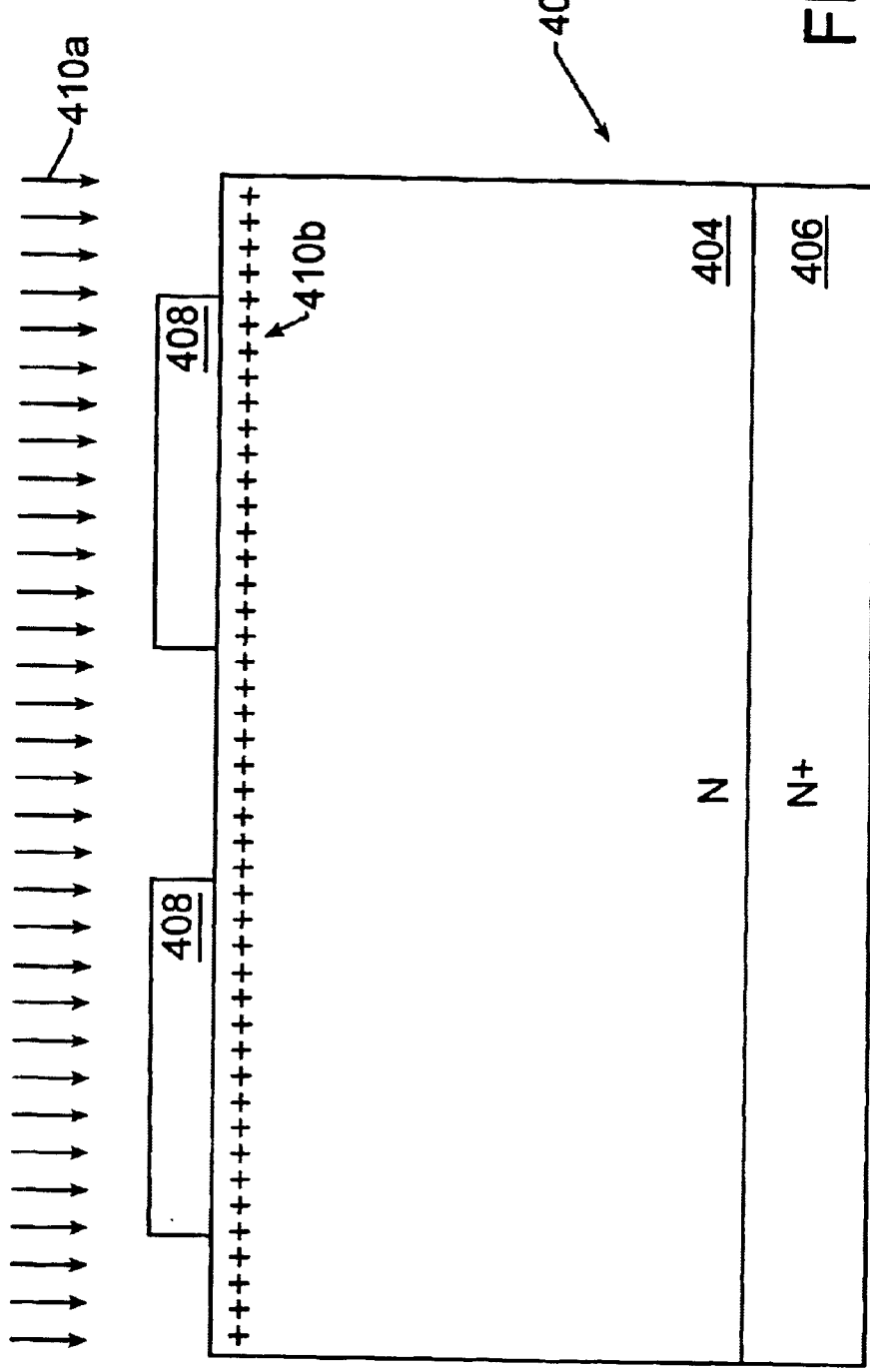
FIGS. 14A–14O are cross-sectional views of intermediate structures that illustrate methods of forming vertical UMOS-FET power devices according to embodiments of the present invention.
Figure 14B:
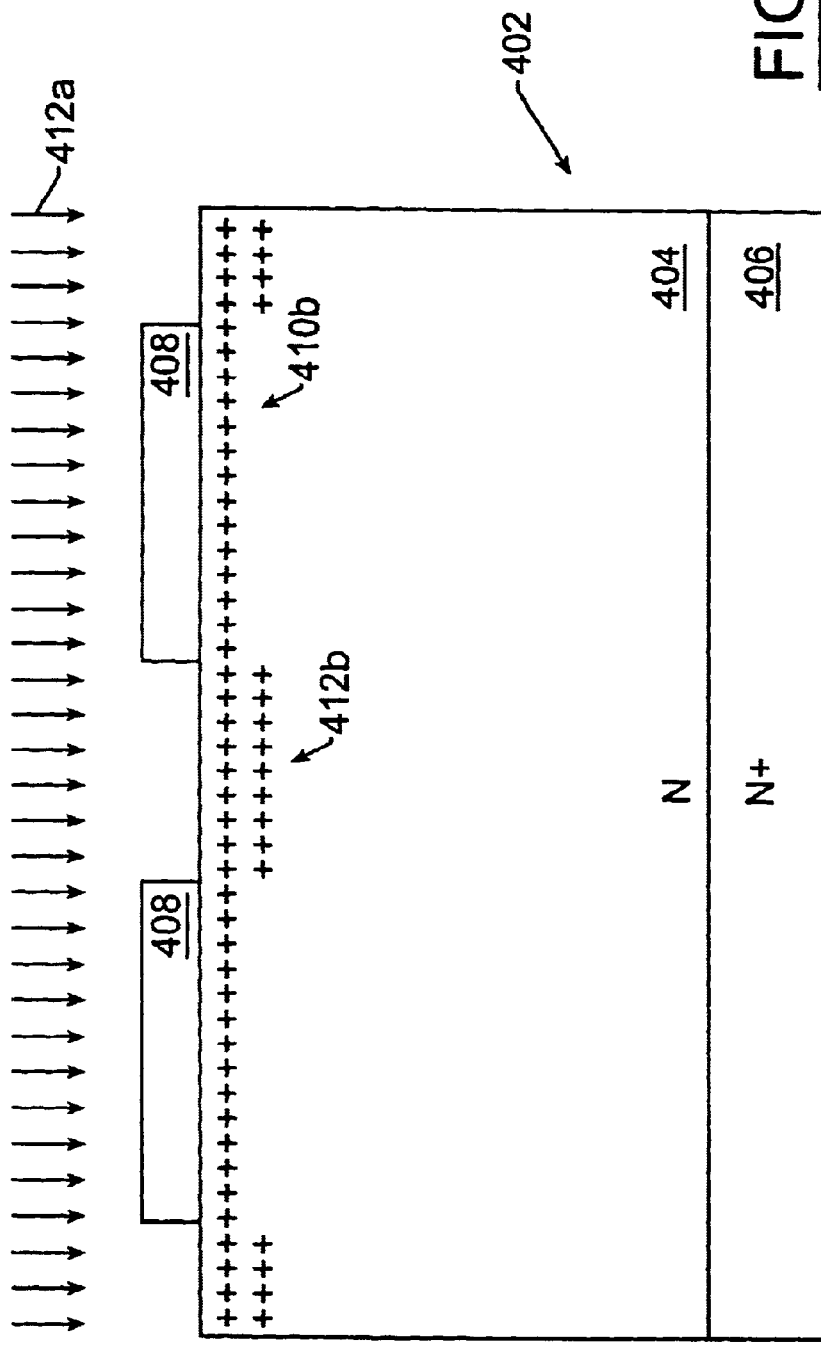
Figure 14C:
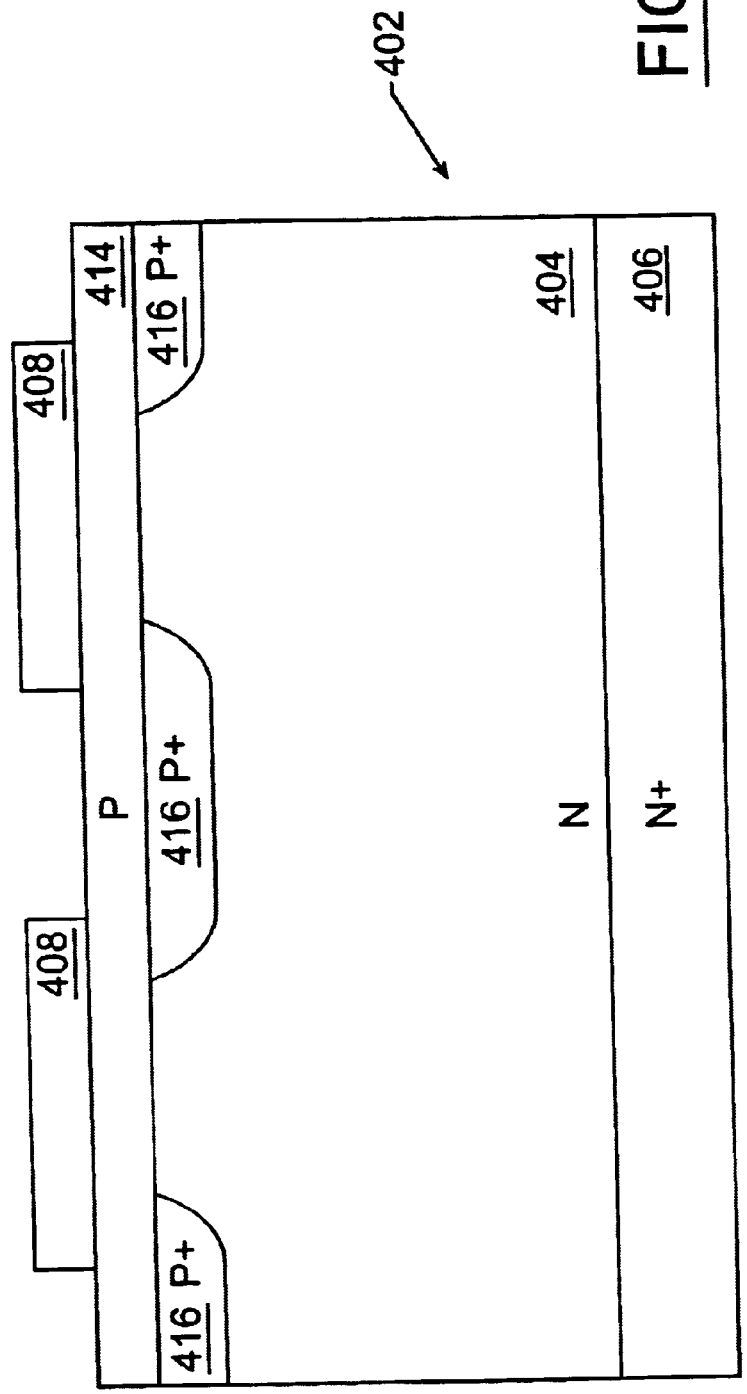
Figure 14D:
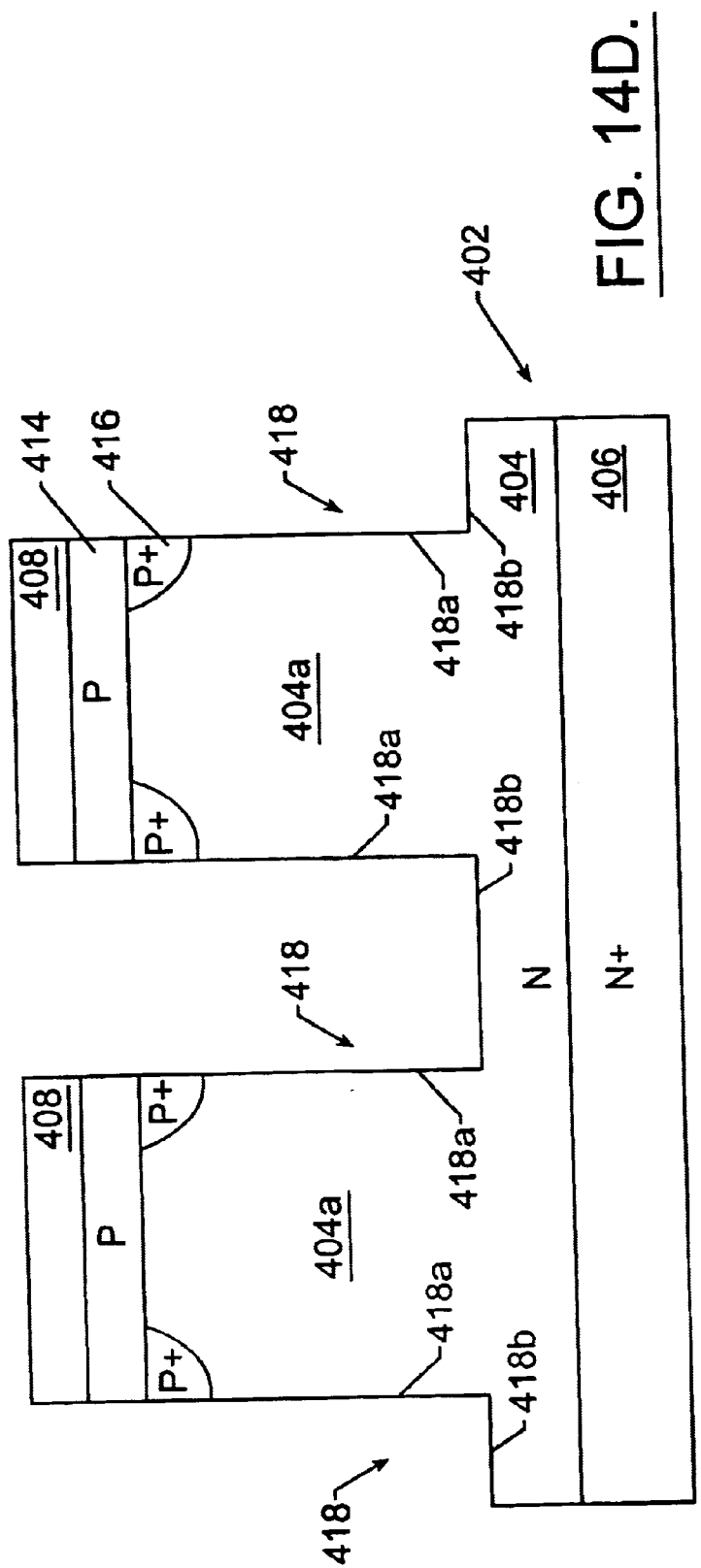
Figure 14E:
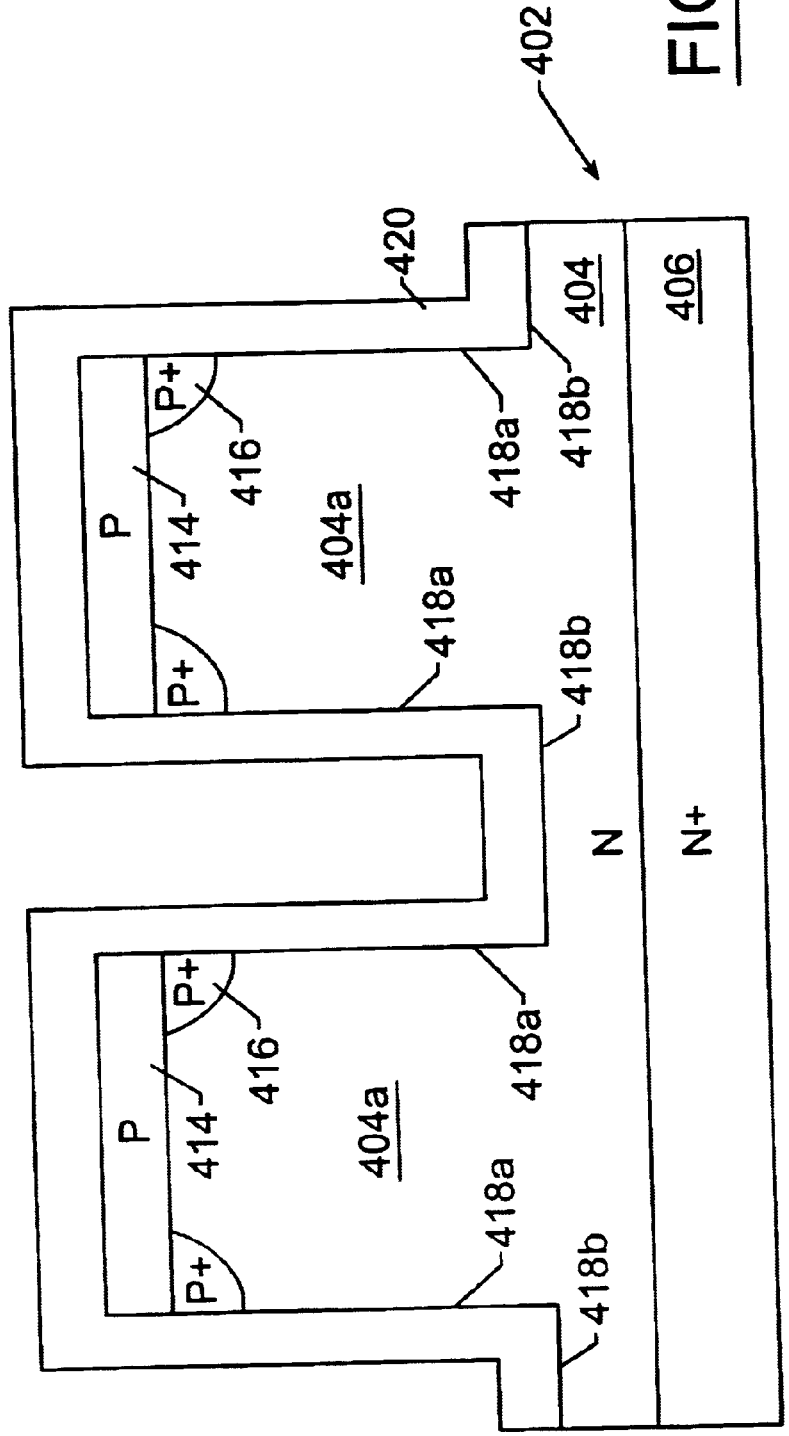
Figure 14F:
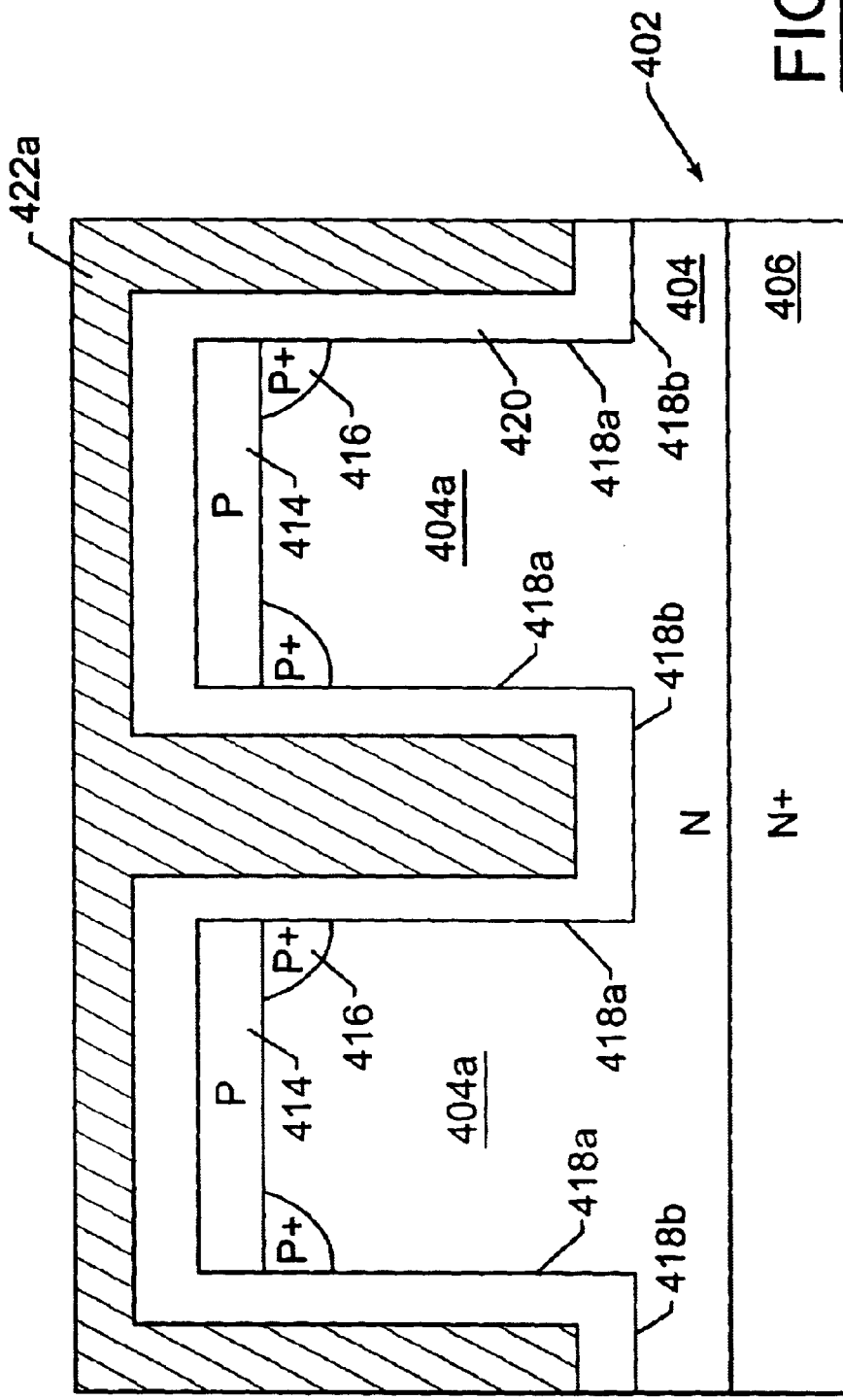
Figure 14G:
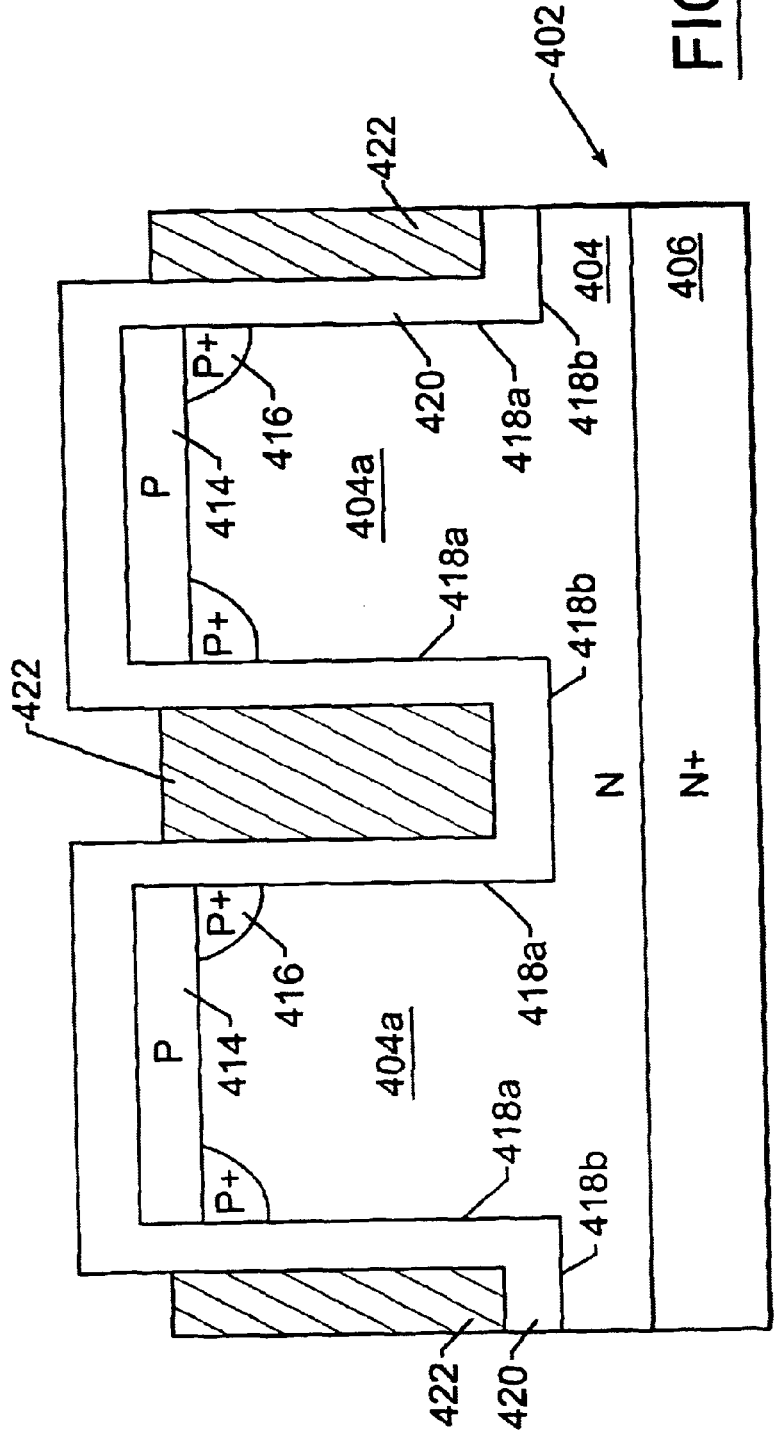
Figure 14H:
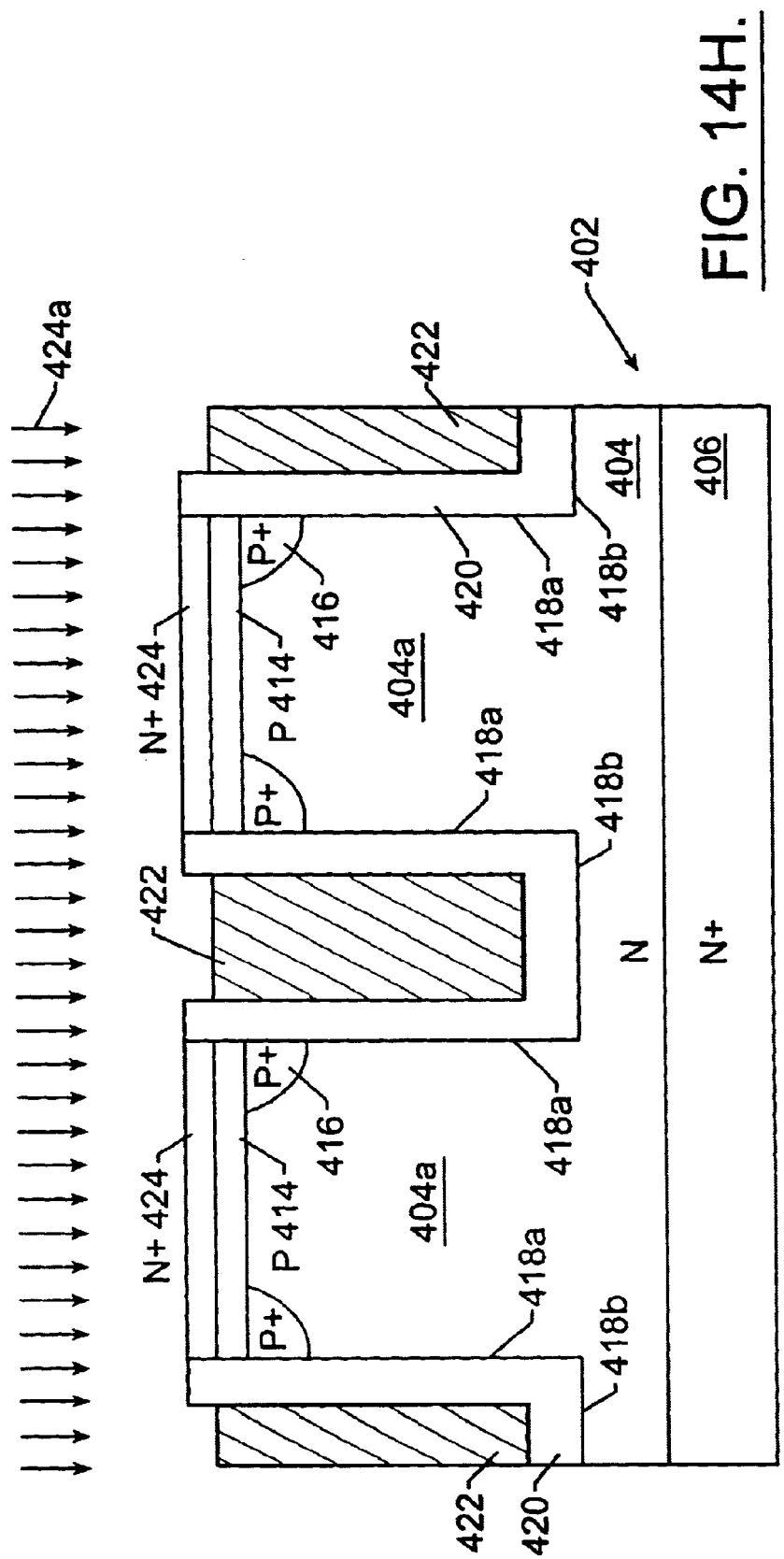
Figure 14I:
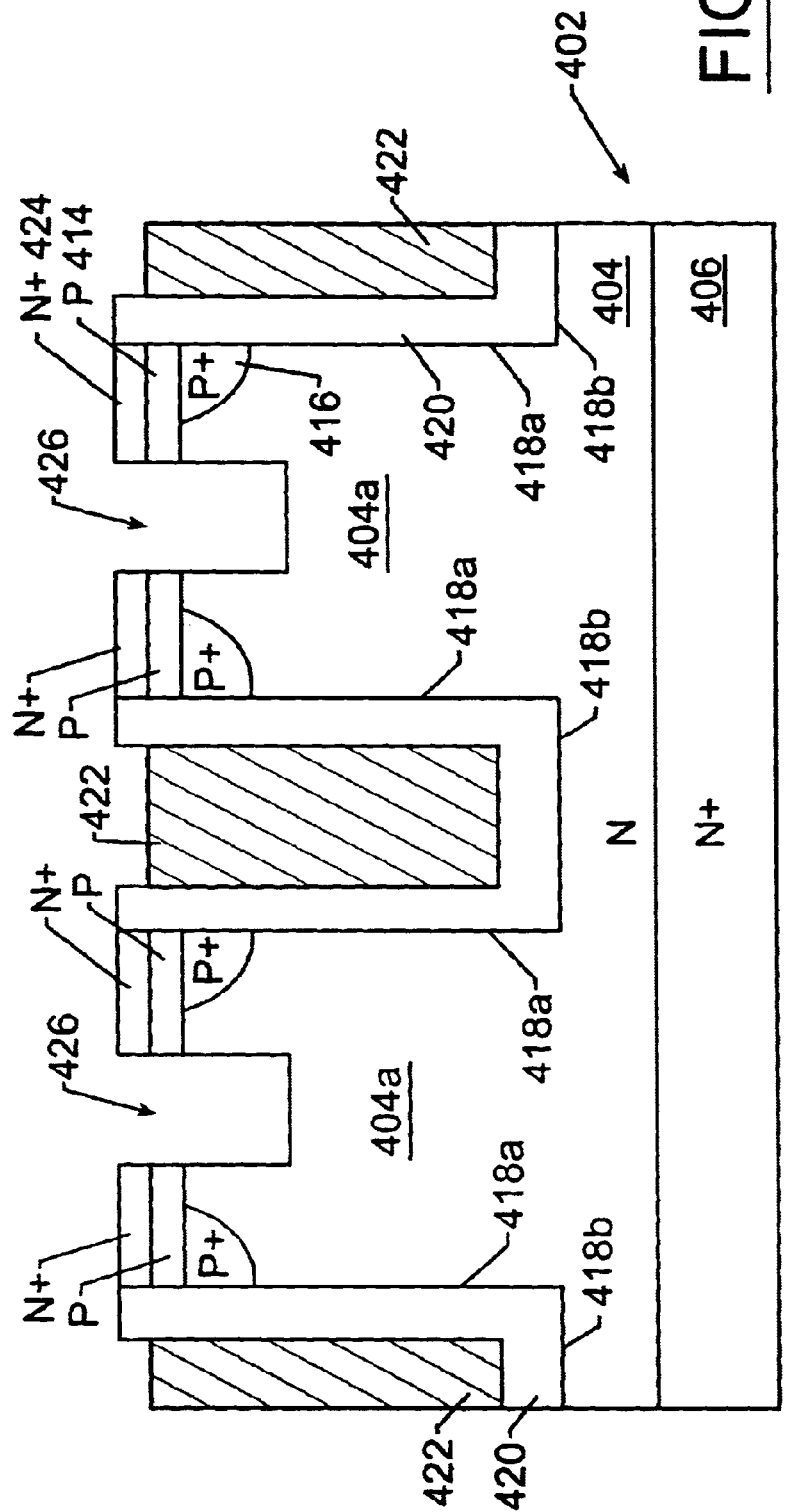
Figure 14J:
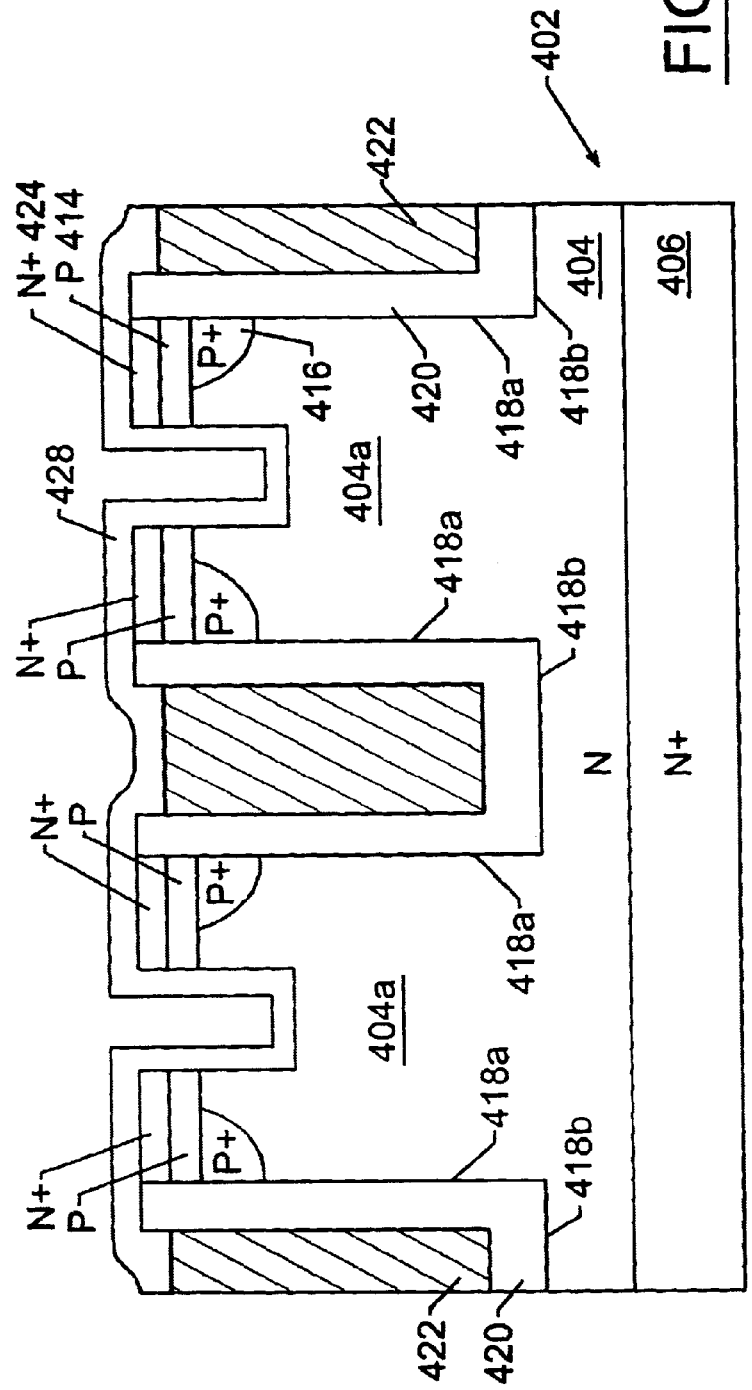
Figure 14K:
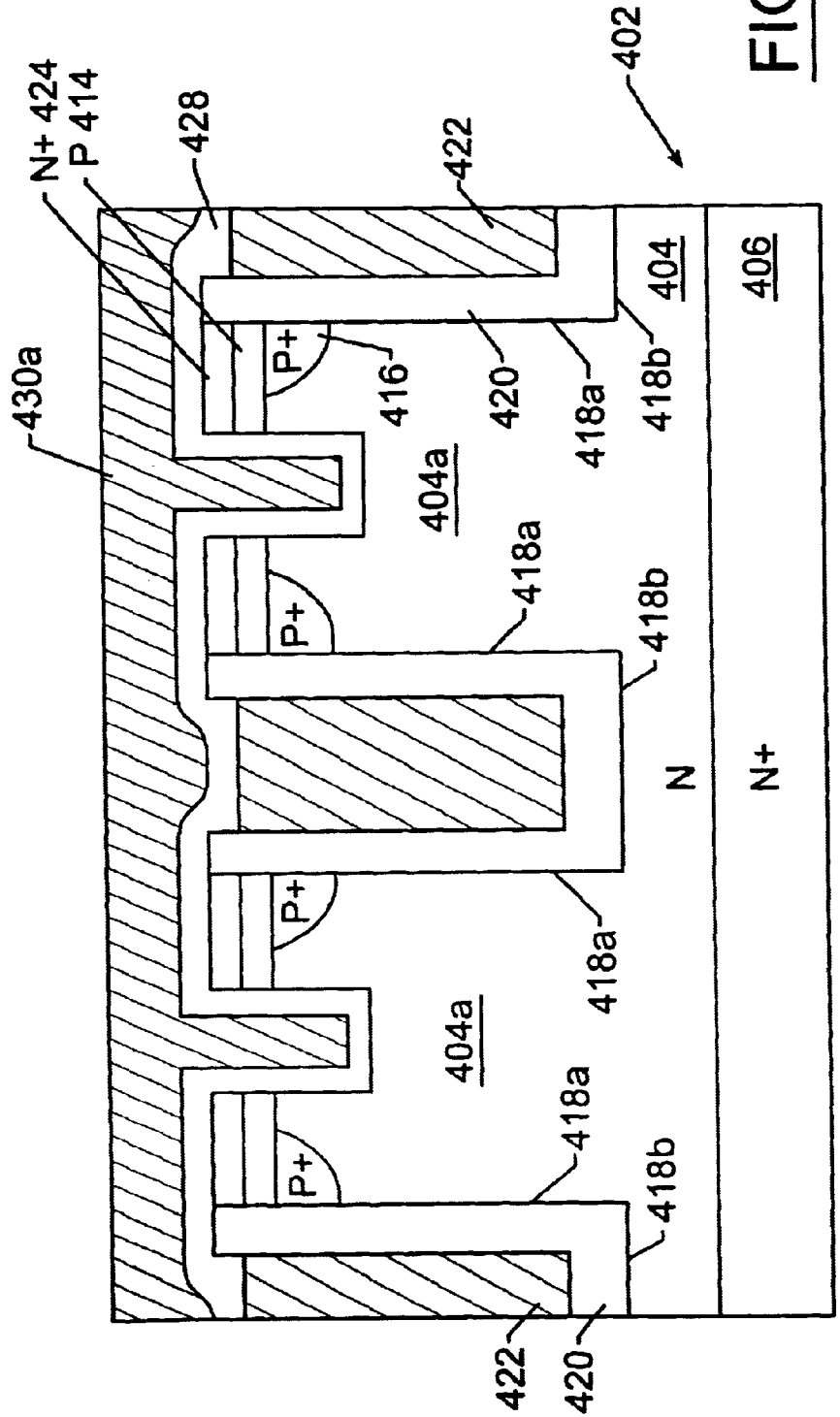
Figure 14L:
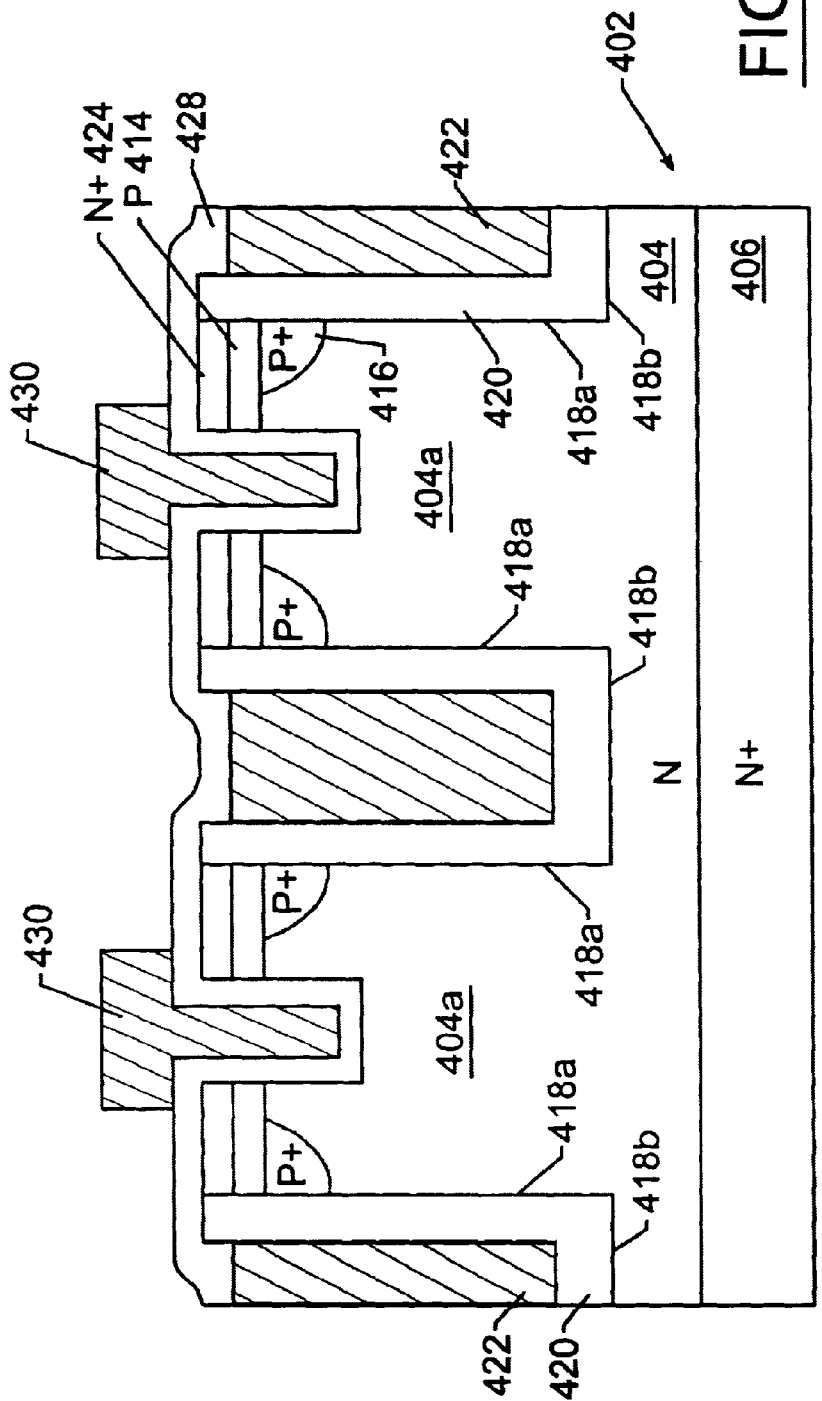
Figure 14M:
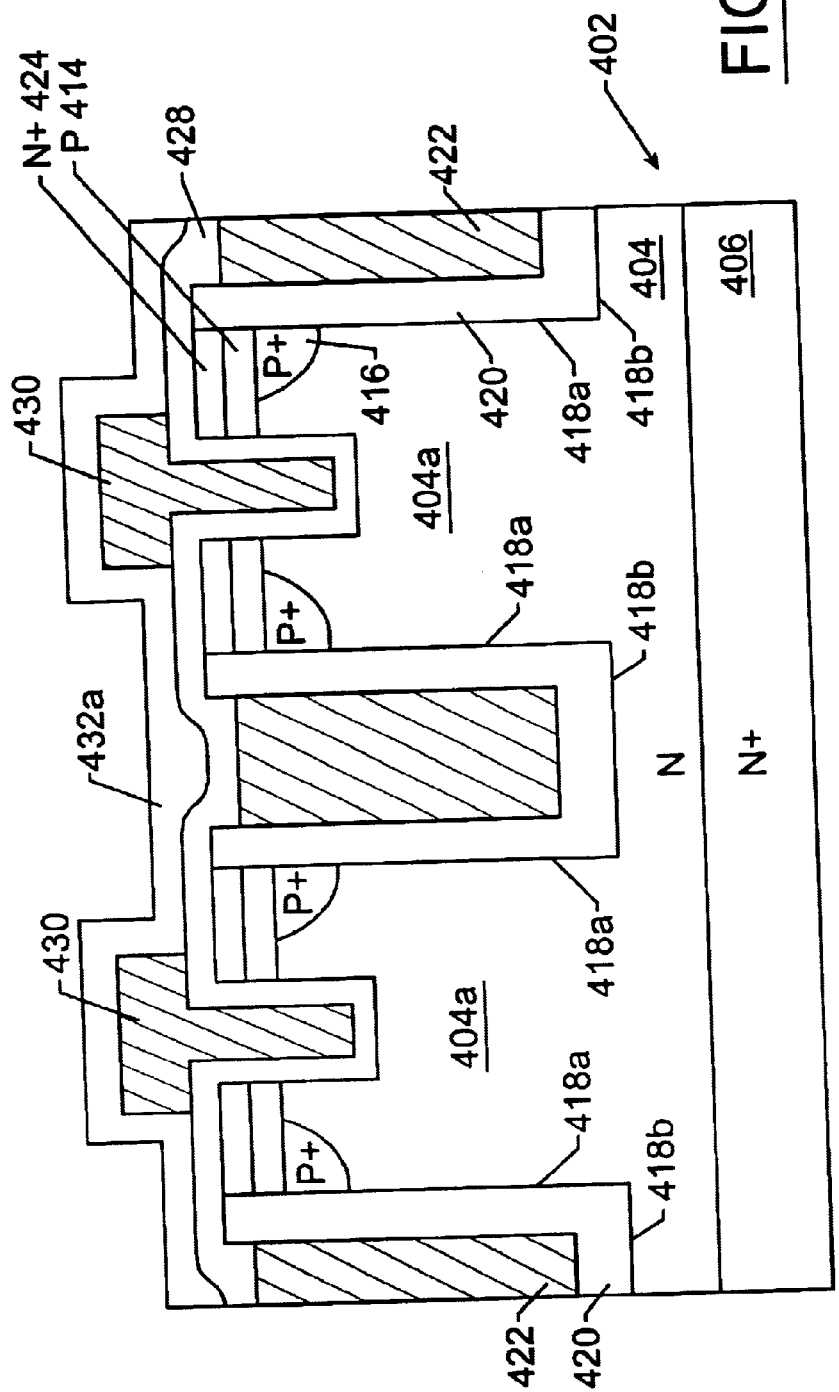
Figure 14N:
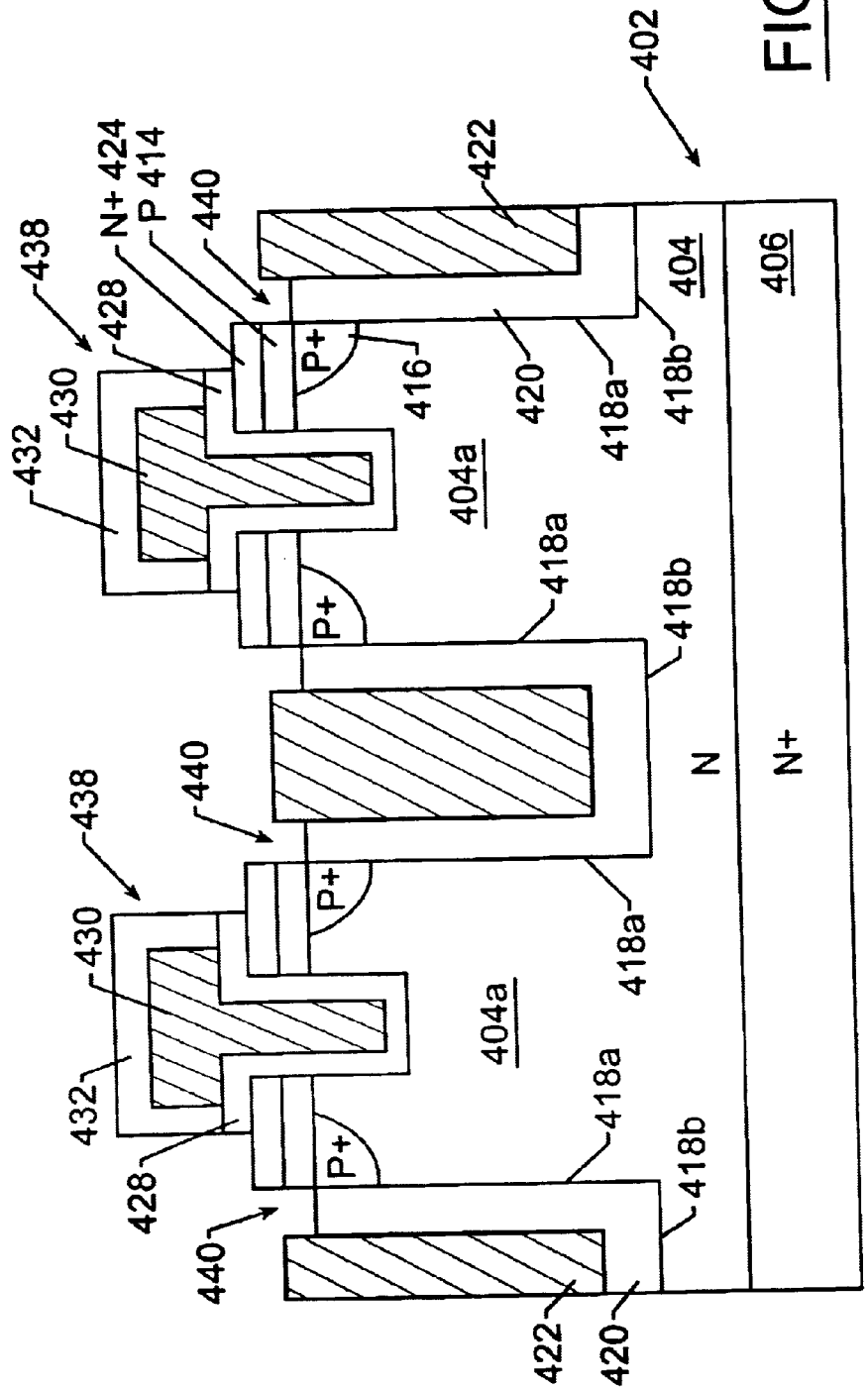
Figure 14O:
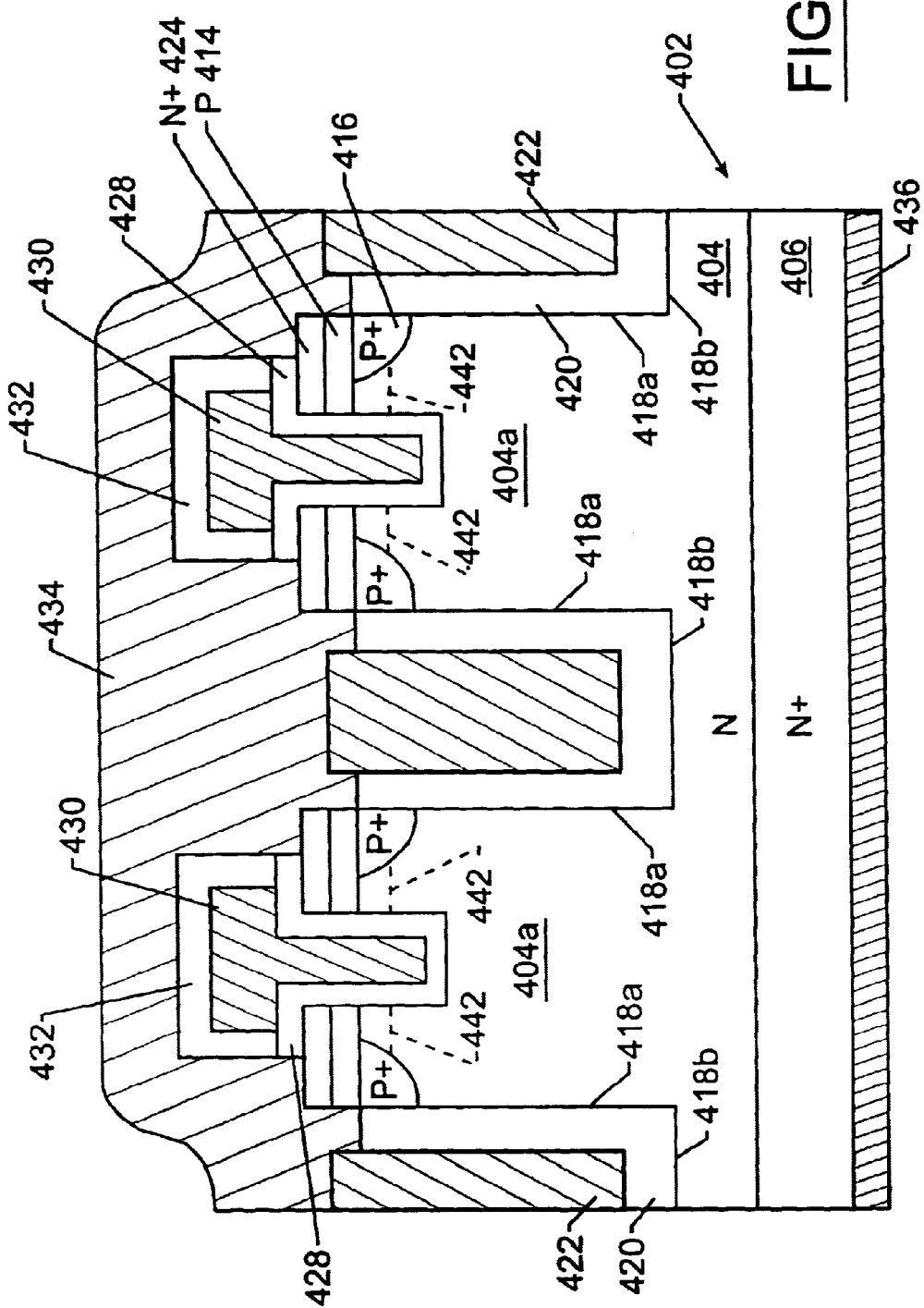

Referring now to FIGS. 14A–14O, preferred methods of forming vertical power devices 400 (e.g., UMOSFETs) according to additional embodiments of the present invention will be described. As illustrated by FIG. 14A, these methods may include forming a base region of second conductivity type in an active portion of a semiconductor substrate 402 by implanting base region dopants 410a of second conductivity type (e.g., P-type) into an upper surface of the substrate 402 to define a preliminary base region 410b therein. This implant step may be performed using a first mask (not shown) having an opening therein that exposes the active portion of the substrate 402. A field oxide isolation region having an opening therein that defines the active portion of the substrate 402 may be used as the first mask. The base region dopants 410a may be implanted at an energy level of about 50 keV and at a dose level of about $5 \times 10^{13}$ cm$^{-2}$. As illustrated, the substrate 402 may comprise a drift region of first conductivity 404 (shown as N) on a more highly doped substrate layer 406 (shown as N+) that comprises a drain region of the vertical power device 400. The drift region 404 may be formed by epitaxially growing an in-situ doped monocrystalline silicon layer on a highly doped silicon wafer. The drift region 404 may be formed as a uniformly or nonuniformly doped epitaxial layer. For example, the drift region 404 may have a linearly graded doping profile, as described more fully in U.S. Pat. Nos. 5,637,898 and 5,998,833 to Baliga and in the aforementioned '414 application (see, e.g., FIG. 3). A second masking layer may then be deposited and patterned on the upper surface to define a second mask 408 having a plurality of openings therein. Referring now to FIG. 14B, base shielding region dopants 412a of second conductivity type are then preferably implanted into the drift region 404, using the second mask 408 as an implant mask. This implant step, which is optional, may be performed at an implant energy of about 100 keV and at a dose level of about $1 \times 10^{14}$ cm$^{-2}$. Based on this sequence of steps, a plurality of preliminary base shielding regions 412b are defined within the drift region 404 and the lateral edges of these regions are self-aligned to the lateral edges of the second mask 408. Because of the higher implant energy, the preliminary base shielding regions 412b are formed deeper than the preliminary base region 410b.

Referring now to FIG. 14C, an annealing step may then be performed to at least partially drive-in the implanted dopants (410a and 412a) vertically and laterally. This annealing step results in the definition of a blanket base region 414 (shown as P) adjacent the upper surface of the substrate 402 and a plurality of more highly doped base shielding regions 416 (shown as P+) that are self-aligned to the openings in the second mask 408. This annealing step may be performed for a duration of about 60 minutes and at a temperature of about 1000° C. A selective etching step is then performed to define a plurality of deep trenches 418 having opposing sidewalls 418a and bottoms 418b, as illustrated by FIG. 14D. The deep trenches may have a depth of about 5 microns. The deep trenches 418 define a plurality of drift region mesas 404a therebetween. These drift region mesas 404a may have a width of about 2 microns. These trenches 418 may be striped-shaped and extend lengthwise in parallel in a third dimension (not shown). These trenches 418 may be formed by etching the substrate 402, using the second mask 408 as an etching mask. Based on this sequence of steps, the base shielding regions 416 are self-aligned with the sidewalls 418a of the trenches 418 because both the base shielding regions 416 and sidewalls 418a are self-aligned to the sidewalls of the second mask 408. Referring now to FIG. 14E, a blanket electrically insulating layer 420 is then conformally deposited onto the substrate 402, as illustrated. This blanket electrically insulating layer 420 may comprise a silicon dioxide layer having a thickness of about 350 nm (3500 Å). A blanket electrically conductive layer 422a may then be deposited on the blanket electrically insulating layer 420, as illustrated by FIG. 14F. This blanket electrically conductive layer 422a may comprise a highly doped polysilicon layer (e.g., N+ polysilicon) having a thickness of about 1500 nm (15,000 Å).

Referring now to FIG. 14G, a planarization step may then be performed to etch-back the blanket electrically conductive layer 422a into the trenches 418 and thereby define a plurality of electrodes 422. Next, the blanket electrically insulating layer 420 is etched back to reveal upper surfaces of each of the drift region mesas 404a, as illustrated by FIG. 14H. Then, source region dopants 424a of first conductivity type (e.g., N-type) are implanted into the upper surface of the substrate 402. These source region dopants 424a may be implanted at an energy level of about 50 keV and at a dose level of about $1 \times 10^{16}$ cm$^{-2}$. An annealing step may then be performed to drive-in the implanted source region dopants 424a (and further drive-in the base and base shielding region dopants) and thereby define a respective source region 424 adjacent an upper surface of each of the drift region mesas 404a. The annealing step may be performed at a temperature of about 900° C. and for a duration of about 10 minutes.

A third masking layer (not shown) is then deposited on the substrate 402 and patterned to define a plurality of openings therein. These openings may be stripe-shaped openings that are each centered about a middle of each of the drift region mesas 404. An etching step may then be performed to define a relatively shallow striped-shaped trench 426 in each of the drift region mesas 404a, as illustrated by FIG. 14I. These shallow trenches 426 may have a depth of about 1 micron and a width of about 1 micron. Referring now to FIGS. 14J–L, a thermal oxidation step may then be performed to define a gate oxide insulating layer 428 that extends on the sidewalls and bottoms of the shallow trenches 426 and on the upper surfaces of the drift region mesas 404a. The gate oxide insulating layer 428 may have a thickness of about 50 nm (500 Å). Another blanket electrically conductive layer 430a is then conformally deposited on the substrate 402. The blanket electrically conductive layer 430a may comprise highly doped polysilicon or polycide, for example. A fourth masking layer (not shown) is then deposited and patterned on the blanket electrically conductive layer 430a. The patterned fourth masking layer is then used as an etching mask to selectively pattern the blanket electrically conductive layer 430a into a plurality of T-shaped gate electrodes 430 that extend onto upper surfaces of the drift region mesas 404a. A planarization step need not be performed to etch back the blanket electrically conductive layer 430a until each of the gate electrodes 430 is recessed within respective shallow trenches 426. Advantages achieved by using T-shaped gate electrodes are more fully described in U.S.

Pat. No. 6,303,410 to Baliga, the disclosure of which is hereby incorporated herein by reference. A passivation layer 432a is then formed on the substrate 402, as illustrated by FIG. 14M. This passivation layer 432a may comprise a CVD oxide layer having a thickness of about 500 nm (5000 Å).

Referring now to FIG. 14N, a fifth masking layer (not shown) is then deposited and patterned. This fifth masking layer is then used as an etching mask during a step of selectively etching the passivation layer 432a to define a plurality of insulated gate electrodes 438 that comprise insulating capping layers 432. The duration of the selective etching step is preferably sufficient to define recesses 440 within each of the insulating layers 420. As illustrated, these recesses 440 expose the source regions 424 and base regions 414 along the sidewalls 418a. Referring now to FIG. 14O, conventional metallization steps may then be performed to deposit and pattern a source electrode 434 on an upper surface of the substrate 402 and deposit a drain electrode 436 on a lower surface of the substrate 402. The source electrode 434 is preferably patterned to define ohmic contacts with the source regions 424 and base regions 414 along the sidewalls 418a and with the electrodes 422 in the deep trenches. As further illustrated by FIG. 14O, a relatively highly doped transition region 442 of first conductivity type may be provided between each of the base regions 414 and a respective drift region mesa 404a. As described more fully in the aforementioned '414 application to Baliga and illustrated by FIG. 3 therein, the transition region 442 may have a relatively high N-type doping concentration therein of about $1 \times 10^{17}$ cm$^{-3}$. The relatively highly doped transition regions 442 improve performance by enabling each inversion-layer channel formed in a respective base region 414 during forward on-state conduction to be operated in a linear mode (without channel pinch-off or velocity saturation) while the drift region 404 is simultaneously operated in a velocity saturation mode. The doping concentration in the transition regions 438 is preferably set at a level sufficient to enable forward on-state conduction through the inversion-layer channels at low drain voltages and to maintain the inversion-layer channels in a linear mode of operation as the drain voltage is increased. The highly doped base shielding regions 416 also operate to shield respective base regions 414 by significantly suppressing P-base reach-through effects when the power device 400 is blocking reverse voltages and by causing reverse current to flow through the shielding regions 416 instead of the base regions 414.

Figure 15A:
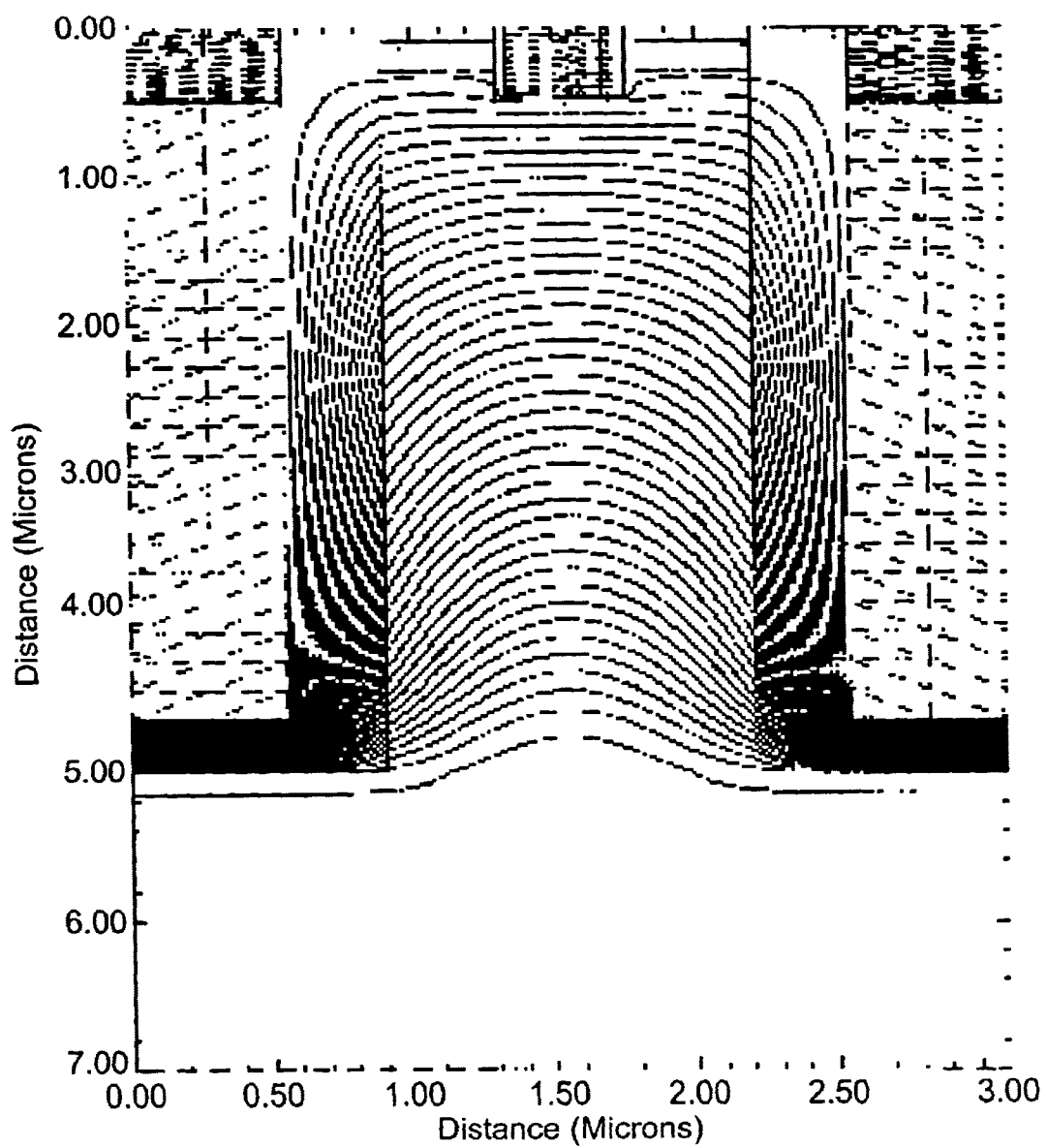
FIG. 15A is a simulation illustrating lines of equal potential when the device of FIG. 5 is supporting a reverse voltage.
Figure 15B:
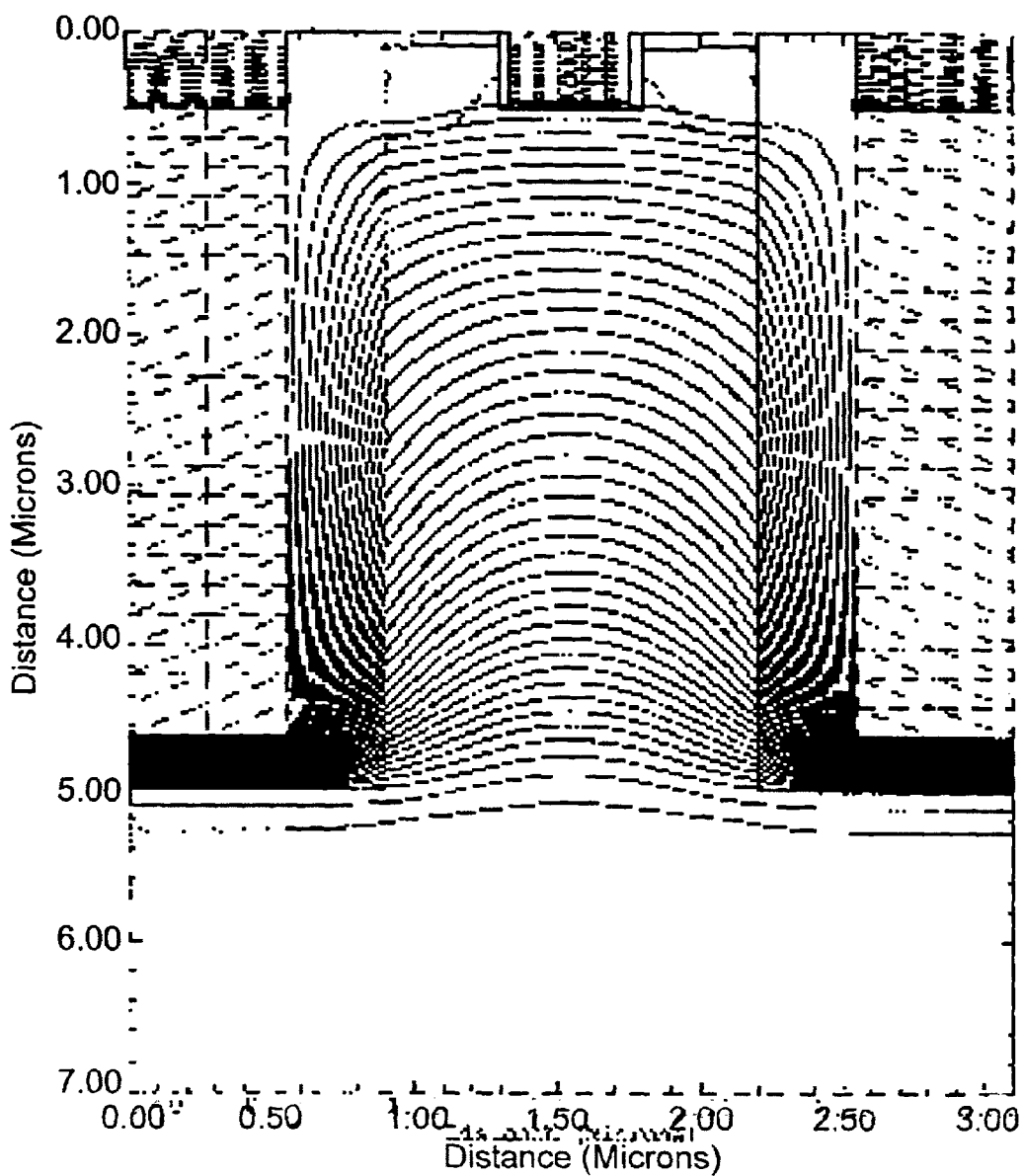
FIG. 15B is a simulation illustrating lines of equal potential when the device of FIG. 14O is supporting a reverse voltage.
Figure 15C:
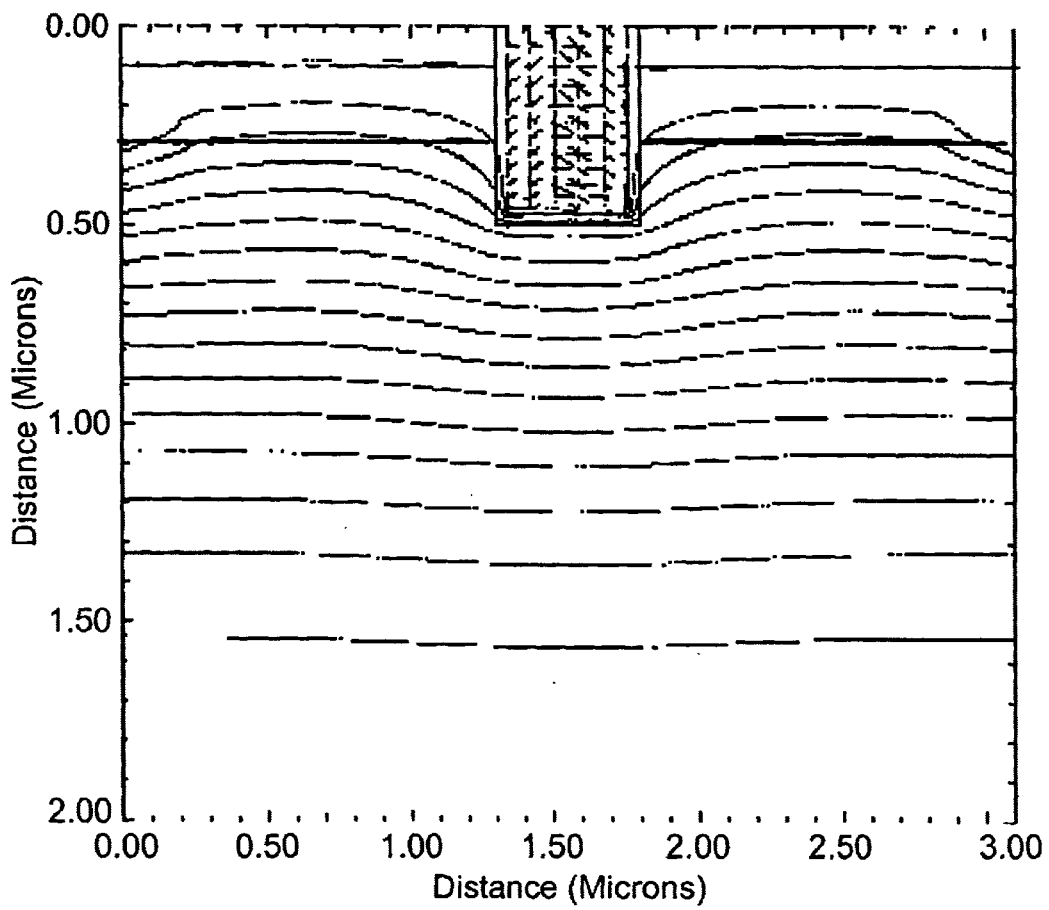
FIG. 15C is a simulation illustrating lines of equal potential when a conventional UMOSFET is supporting a reverse voltage.

Referring now to FIG. 15A, a two-dimensional simulation of the device of FIG. 5 illustrates lines of equal potential when the device is supporting a high reverse voltage. In FIG. 15A, the equal potential line representing the lowest potential extends slightly above a bottom of the shallow trench in which the insulated gate electrode is formed, but does not extend into the P-base region because of the high degree of charge coupling between the drift region mesa and the trench-based insulated source electrodes. By preventing the equal potential lines from extending into the P-base region, P-base reach through effects can be suppressed. A two-dimensional simulation of the device of FIG. 14O reveals improved blocking voltage performance vis-a-vis the device of FIG. 5. For example, FIG. 15B illustrates lines of equal potential when the device of FIG. 14O is supporting a high reverse voltage. In FIG. 15B, the equal potential line representing the lowest potential extends well below a bottom of the shallow trench in which the insulated gate electrode is formed. This shape of the equal potential line of lowest potential suppresses P-base reach through to a high degree and also reduces field crowding at the corners of the shallow trench. As illustrated by FIG. 15C, which shows lines of equal potential when a conventional UMOSFET is supporting a high reverse voltage, field crowding can be excessive if the equal potential lines representing the lower potentials extend above a bottom of a trench in which the gate electrode is formed. Moreover, the extension of the lines of equal potential into the P-base region illustrate a vulnerability to P-base reach through.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A UMOSFET, comprising:
   a semiconductor substrate having a drift region of first conductivity type therein;
   a first stripe-shaped trench in said semiconductor substrate;
   an insulated gate electrode in said first stripe-shaped trench;
   a second stripe-shaped trench that extends in said semiconductor substrate in a direction parallel to said first stripe-shaped trench, said second stripe-shaped trench having a depth that is greater than a depth of said first stripe-shaped trench;
   an insulated source electrode in said second stripe-shaped trench;
   a base region of second conductivity type that extends in the drift region and between opposing sidewalls of said first and second stripe-shaped trenches;
   a source region of first conductivity type in said base region; and
   a source electrode that extends on said semiconductor substrate and is electrically connected to said source region and to said insulated source electrode.

2. The UMOSFET of claim 1, further comprising a third stripe-shaped trench that extends in said semiconductor substrate in a direction parallel to said second stripe-shaped trench; wherein said first stripe-shaped trench extends between said second and third stripe-shaped trenches; and wherein a depth of said third stripe-shaped trench equals the depth of the second stripe-shaped trench.

3. A UMOSFET, comprising:
   a semiconductor substrate having a drift region of first conductivity type therein;
   first and second trenches that extend in said semiconductor substrate and define a drift region mesa therebetween;
   first and second insulated source electrodes in said first and second trenches, respectively; and
   a UMOSFET comprising a third trench that is shallower than said first and second trenches, in the drift region mesa.

4. The UMOSFET of claim 3, further comprising a first base shielding region of second conductivity type that forms a non-rectifying junction with a base region of said UMOSFET and a rectifying junction with the drift region and extends adjacent a first sidewall of said first trench.

5. The UMOSFET of claim 4, wherein said first base shielding region is self-aligned with the first sidewall of said first trench.

6. The UMOSFET of claim 3, further comprising a transition region of first conductivity type that forms a rectifying junction with a base region of said UMOSFET and a non-rectifying junction with the drift region.

7. The UMOSFET of claim 4, further comprising a transition region of first conductivity type that forms a rectifying junction with a base region of said UMOSFET and a non-rectifying junction with the drift region.

8. The UMOSFET of claim 5, further comprising a transition region of first conductivity type that forms a rectifying junction with a base region of said UMOSFET and a non-rectifying junction with the drift region.

* * * * *